(12) United States Patent
Darwish et al.

(10) Patent No.: US 8,581,341 B2
(45) Date of Patent: Nov. 12, 2013

(54) POWER MOSFET WITH EMBEDDED RECESSED FIELD PLATE AND METHODS OF FABRICATION

(75) Inventors: Mohamed N. Darwish, Campbell, CA (US); Jun Zeng, Torrance, CA (US); Shih-Tzung Su, Shulin (TW); Richard A. Blanchard, Los Altos, CA (US)

(73) Assignee: MaxPower Semiconductor, Inc., Santa Clara, CA (US)

( * ) Notice: Subject to any disclaimer, the term of this patent is extended or adjusted under 35 U.S.C. 154(b) by 211 days.

(21) Appl. No.: 13/089,326

(22) Filed: Apr. 19, 2011

(65) Prior Publication Data

US 2011/0254088 A1    Oct. 20, 2011

Related U.S. Application Data

(60) Provisional application No. 61/326,210, filed on Apr. 20, 2010, provisional application No. 61/332,789, filed on May 9, 2010, provisional application No. 61/334,573, filed on May 13, 2010.

(51) Int. Cl.
    *H01L 29/66* (2006.01)

(52) U.S. Cl.
    USPC ..... 257/340; 257/330; 257/341; 257/E29.009

(58) Field of Classification Search
    USPC ........... 257/340, 341, E29.255, 330, E29.009
    See application file for complete search history.

(56) References Cited

U.S. PATENT DOCUMENTS

| | | | | |
|---|---|---|---|---|
| 6,710,403 | B2 * | 3/2004 | Sapp | 257/330 |
| 7,345,342 | B2 * | 3/2008 | Challa et al. | 257/341 |
| 7,655,975 | B2 * | 2/2010 | Hirler et al. | 257/331 |
| 2006/0060916 | A1 * | 3/2006 | Girdhar et al. | 257/330 |
| 2008/0073707 | A1 * | 3/2008 | Darwish | 257/330 |
| 2008/0197407 | A1 * | 8/2008 | Challa et al. | 257/330 |
| 2009/0008709 | A1 * | 1/2009 | Yedinak et al. | 257/331 |
| 2009/0206924 | A1 * | 8/2009 | Zeng et al. | 327/581 |
| 2010/0301410 | A1 * | 12/2010 | Hirler | 257/334 |

* cited by examiner

*Primary Examiner* — Cheung Lee
*Assistant Examiner* — Jeremy Joy
(74) *Attorney, Agent, or Firm* — Robert O. Groover, III; Gwendolyn S. S. Groover; Groover & Associates PLLC

(57) ABSTRACT

Semiconductor power devices, and related methods, wherein a recessed contact makes lateral ohmic contact to the source diffusion, but is insulated from the underlying recessed field plate (RFP). Such an insulated RFP is here referred to as an embedded recessed field plate (ERFP).

18 Claims, 49 Drawing Sheets

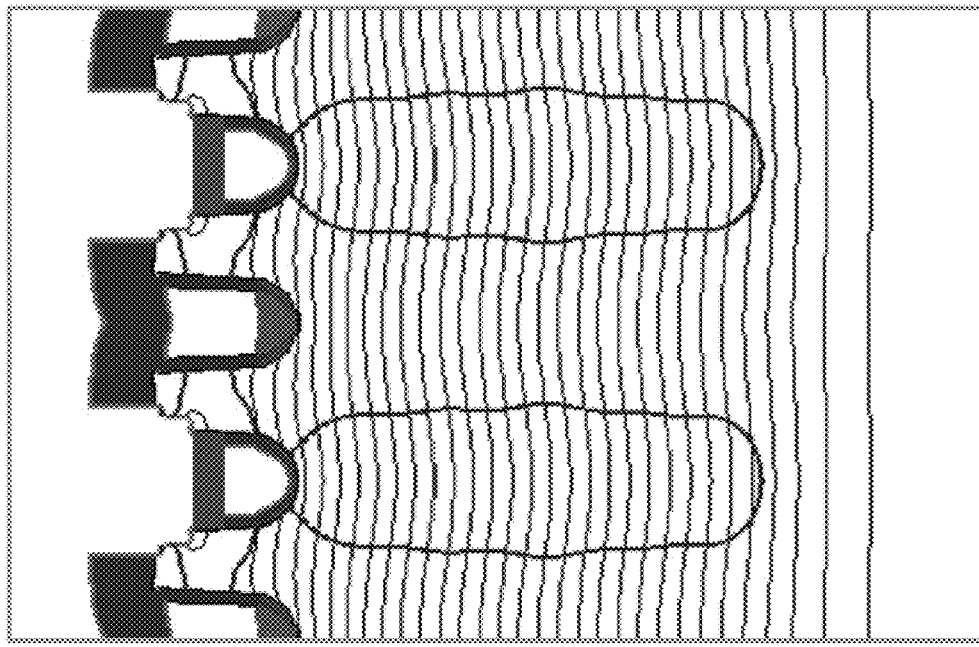
FIG. 4A The potential contours of the device in FIG. 3A

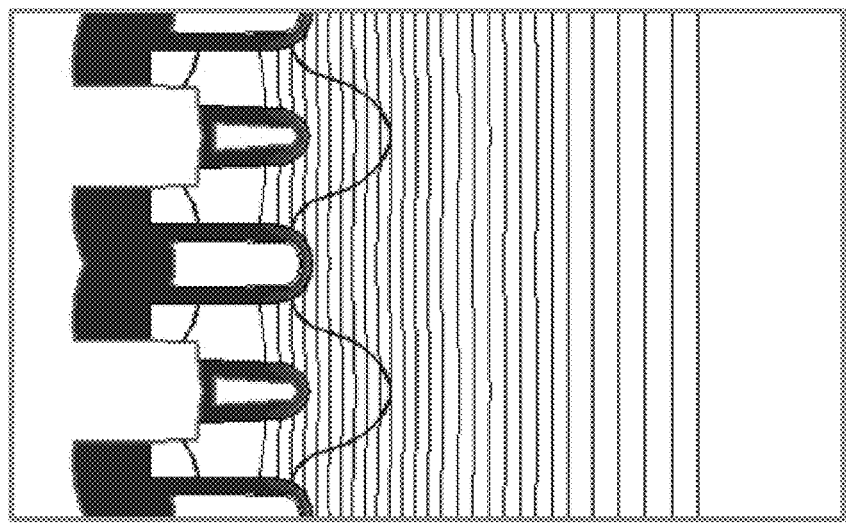
FIG. 4B The potential contours of the device in FIG. 2

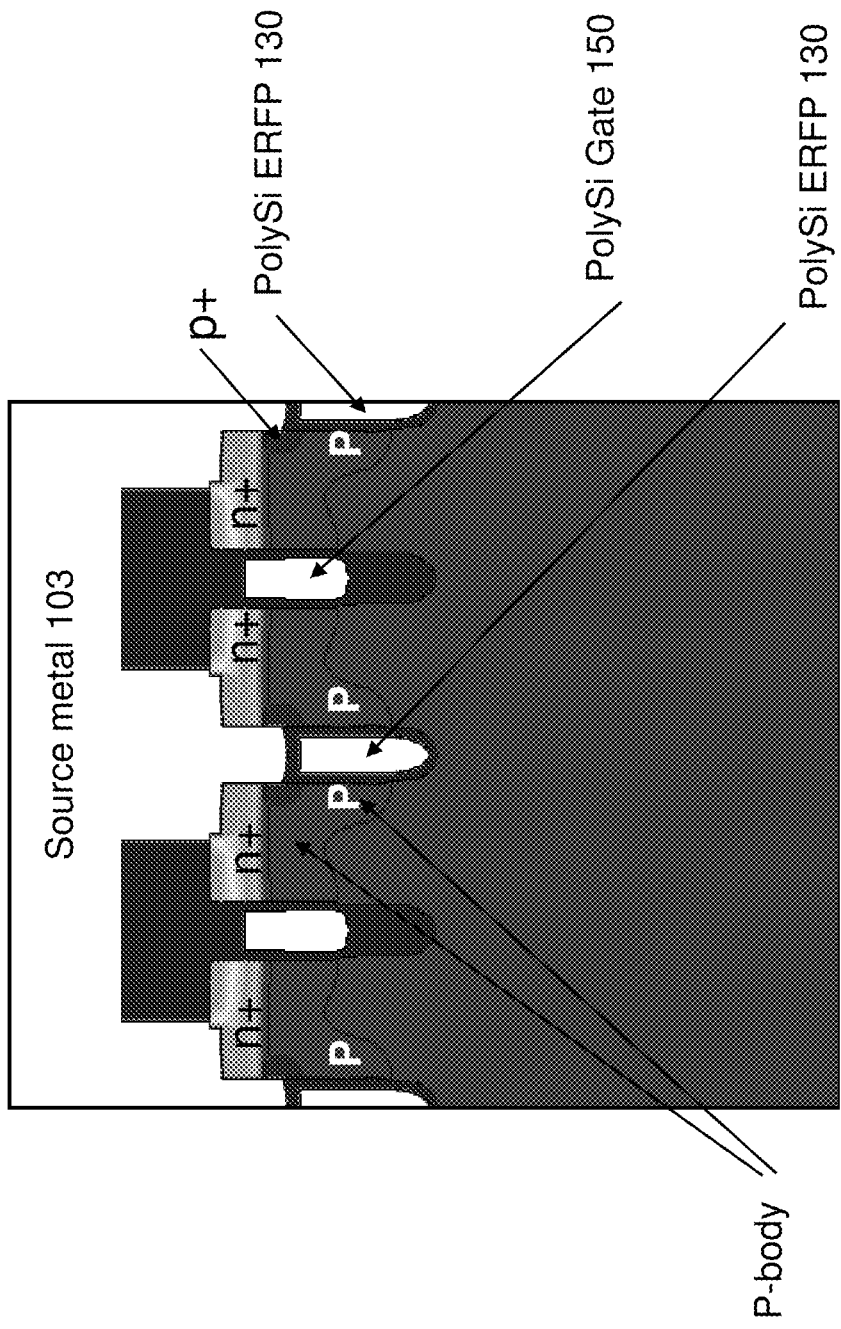
Fig. 6. Simulated Structure

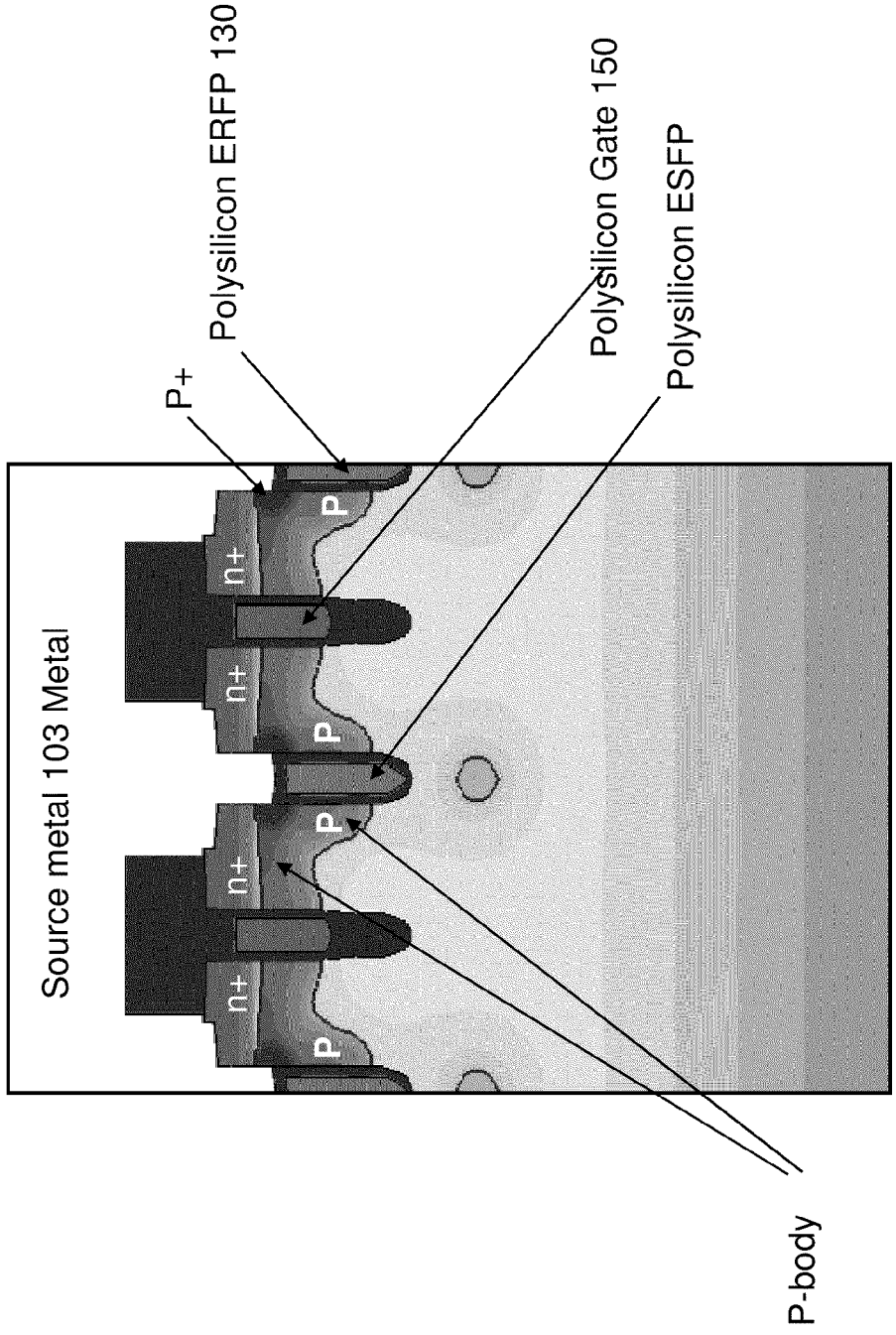
Fig. 7A. Simulated Structure and Doping Profile

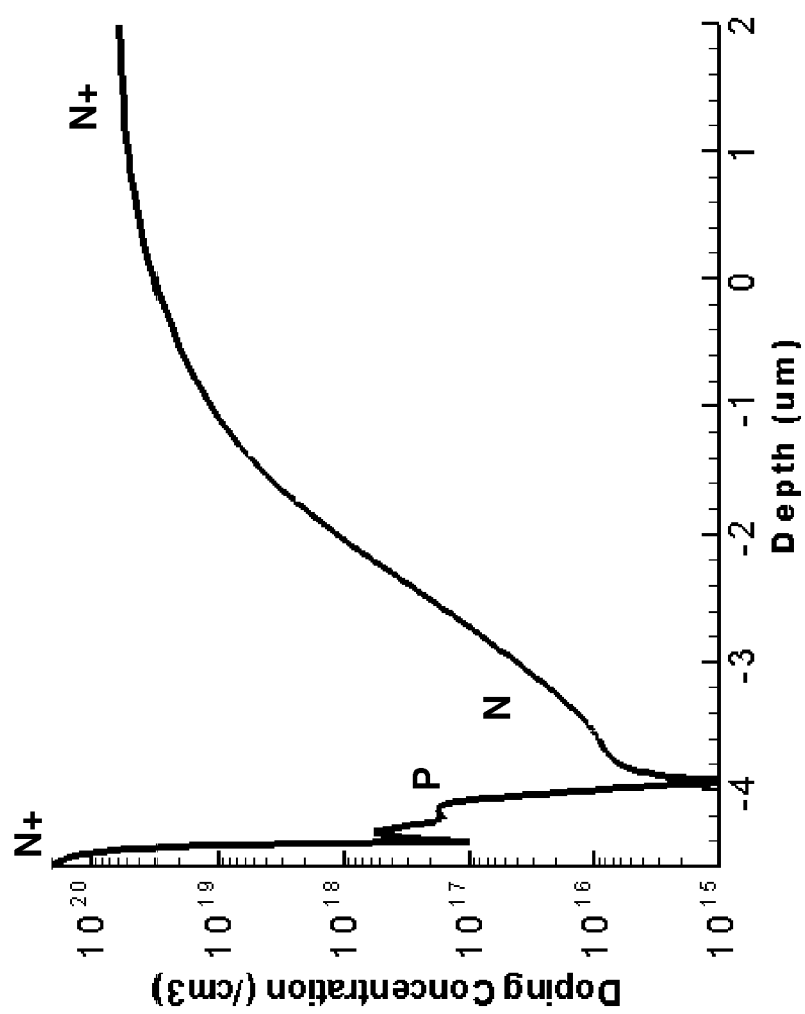

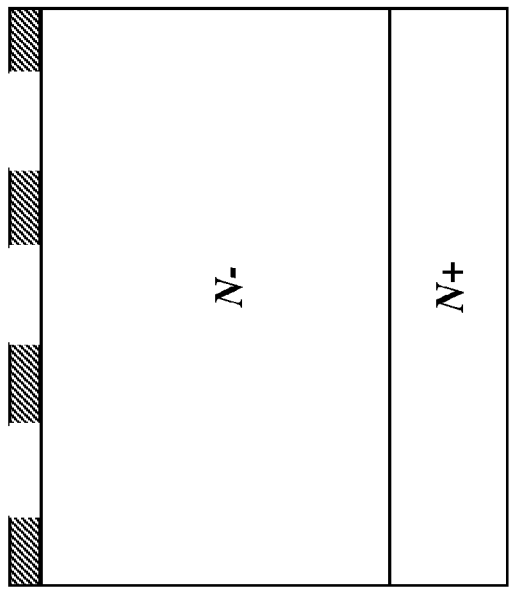
FIG. 9B. Hard Mask
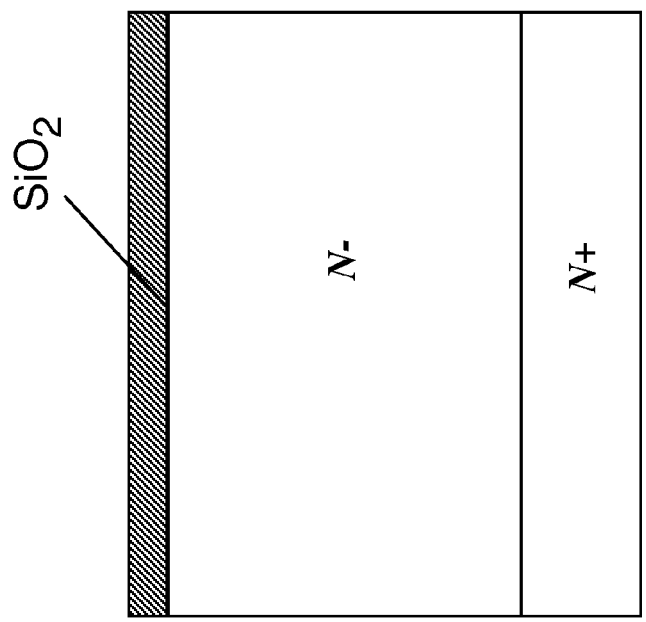
FIG. 9A. Deposit Oxide/Grown

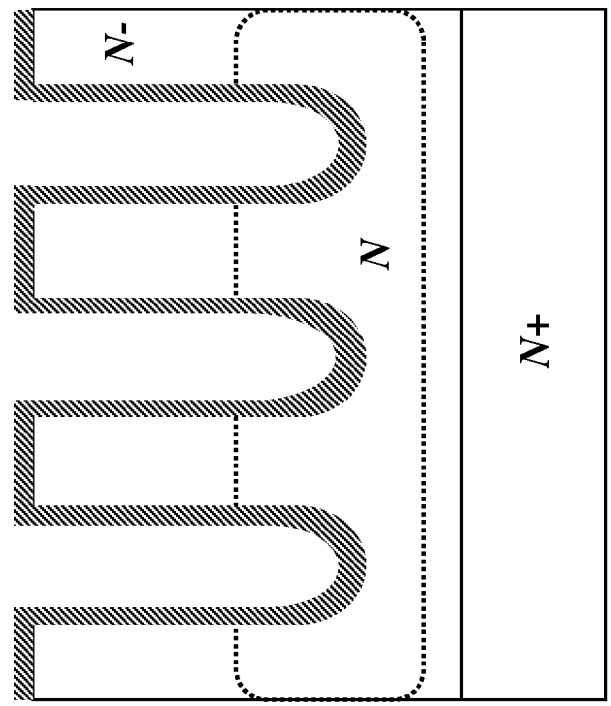
FIG. 9D. Sac Oxidation
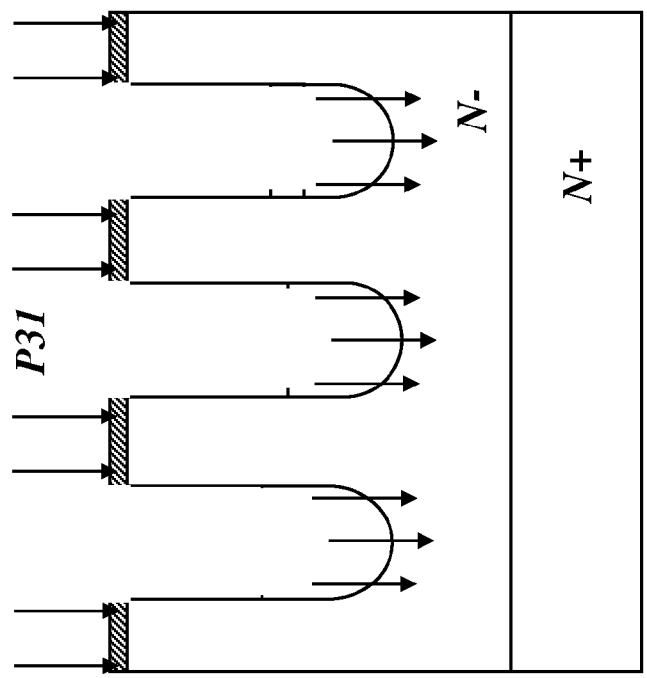
FIG. 9C. Phosphorus Implant

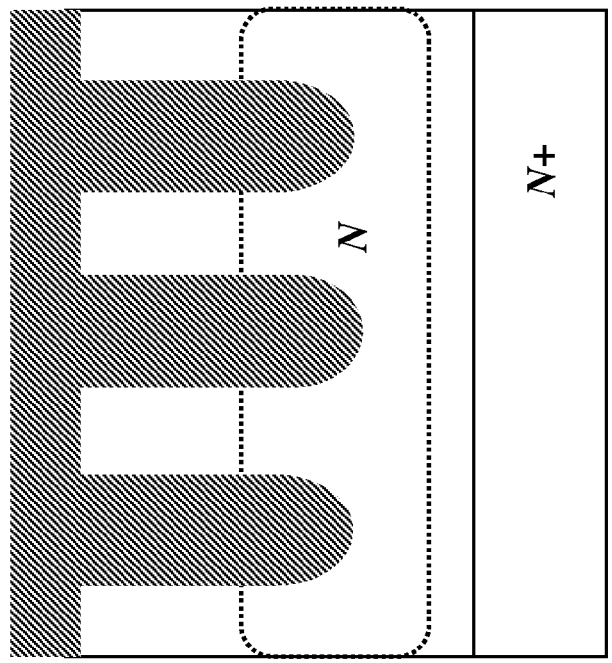
FIG. 9E. Oxide Fill
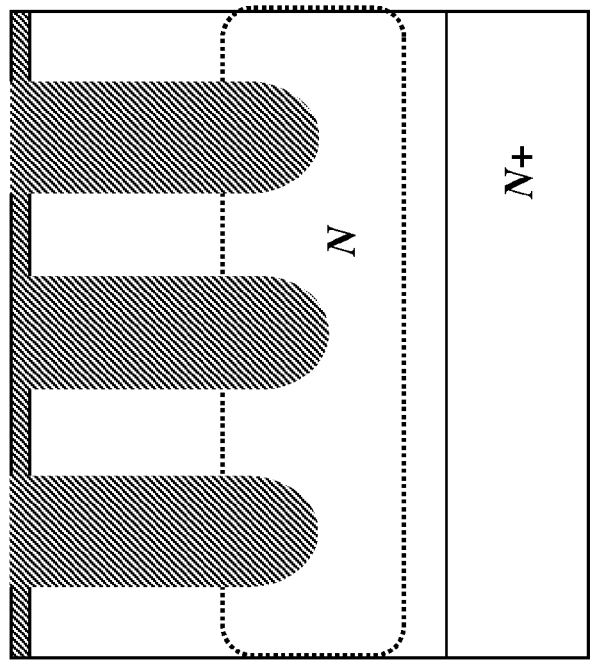
FIG. 9F. Oxide CMP

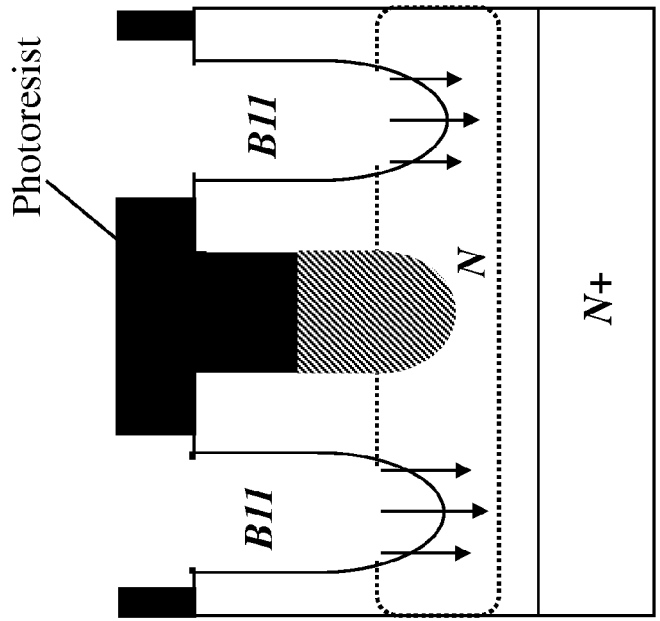
FIG. 9H. Bottom Oxide (BOX) Removal, Boron Implant
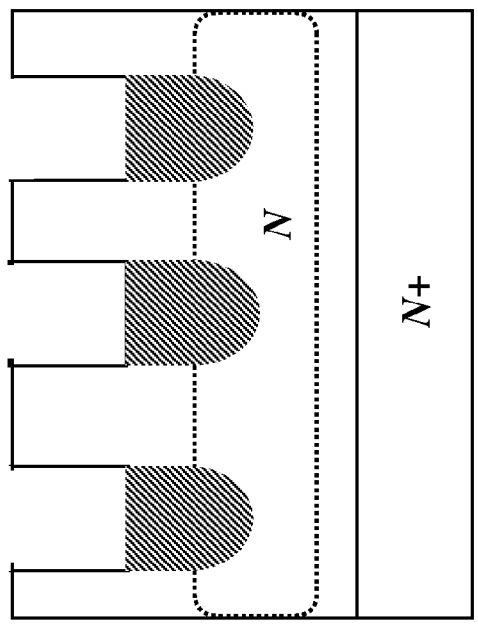
FIG. 9G. Oxide Etch Back

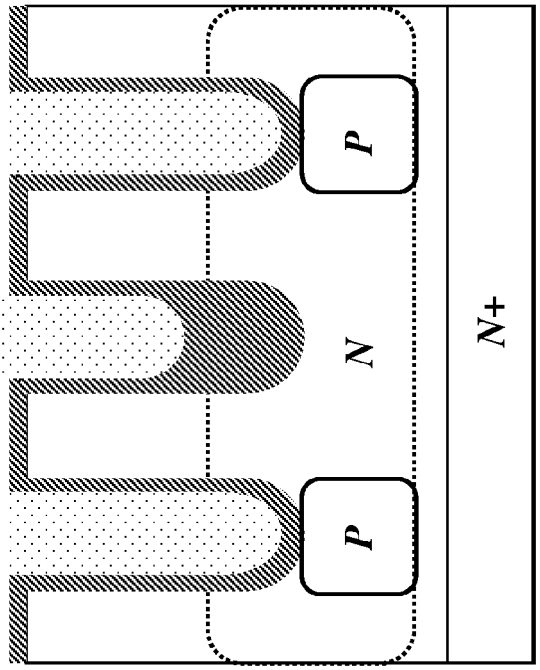
FIG. 9I. Gate 150 Oxidation
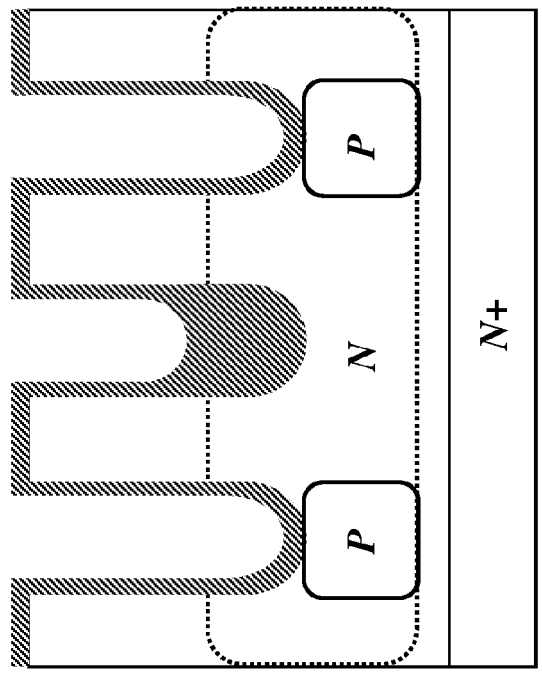
FIG. 9J. Polysilicon Fill

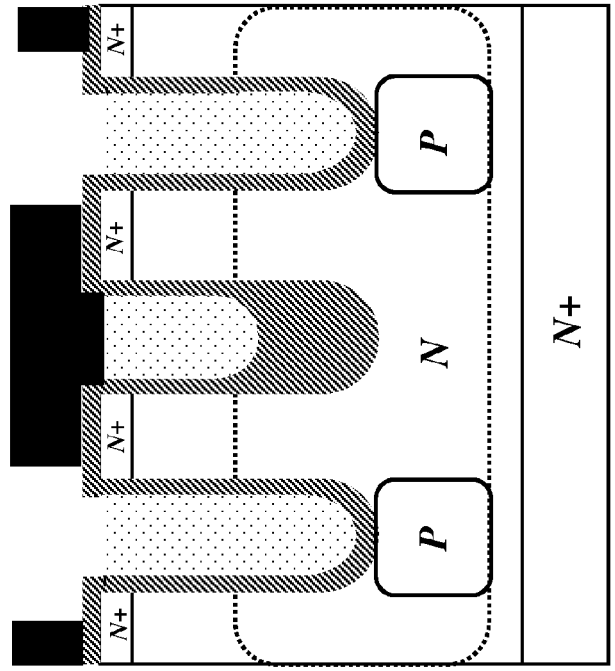
FIG. 9L. Polysilicon Mask
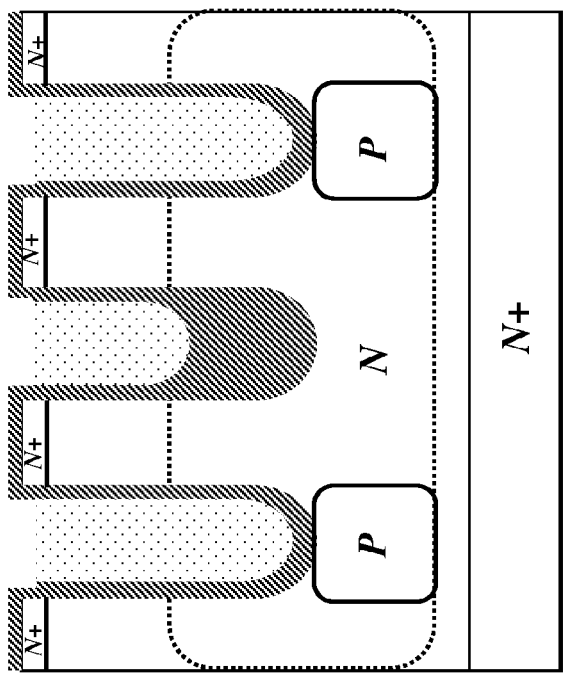
FIG. 9K. Form n+ Source

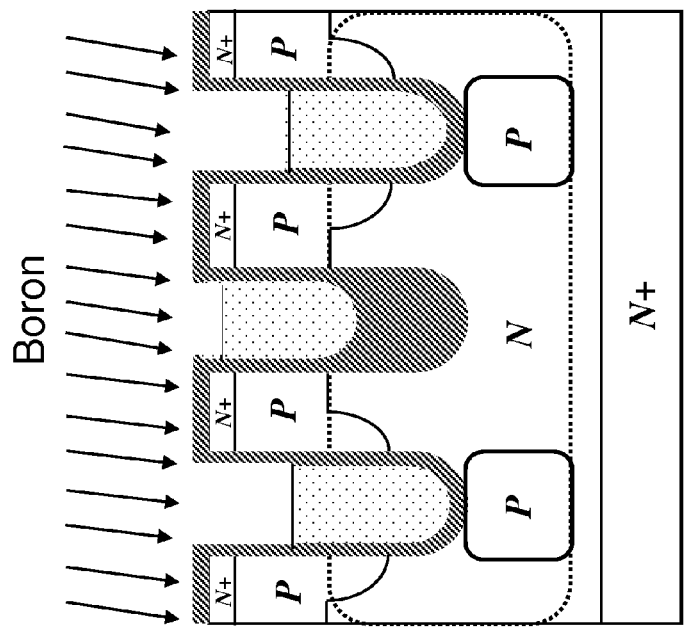
FIG. 9N. Boron Implant/Anneal forming the P-body with non-uniform depth
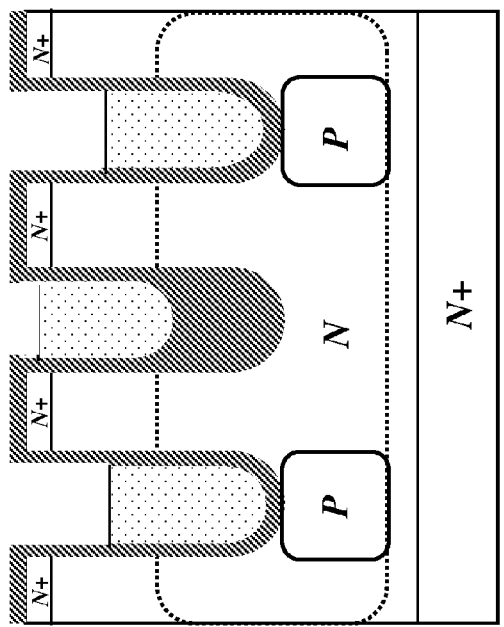
FIG. 9M. Polysilicon Etch Back forming the Embedded Field Plate (ERFP 130)

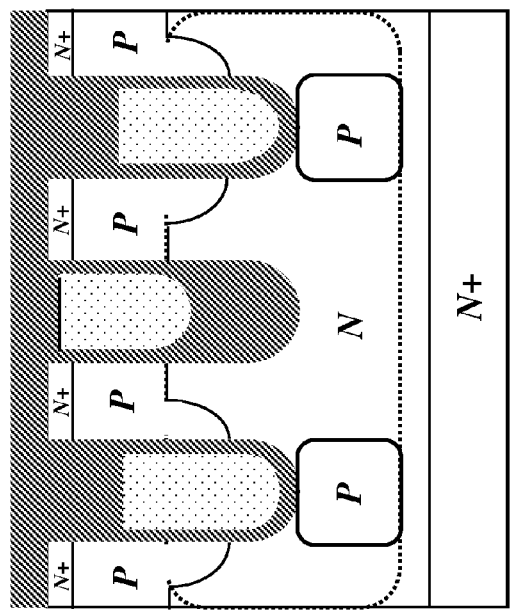
FIG. 9P. ILD Layer Deposition
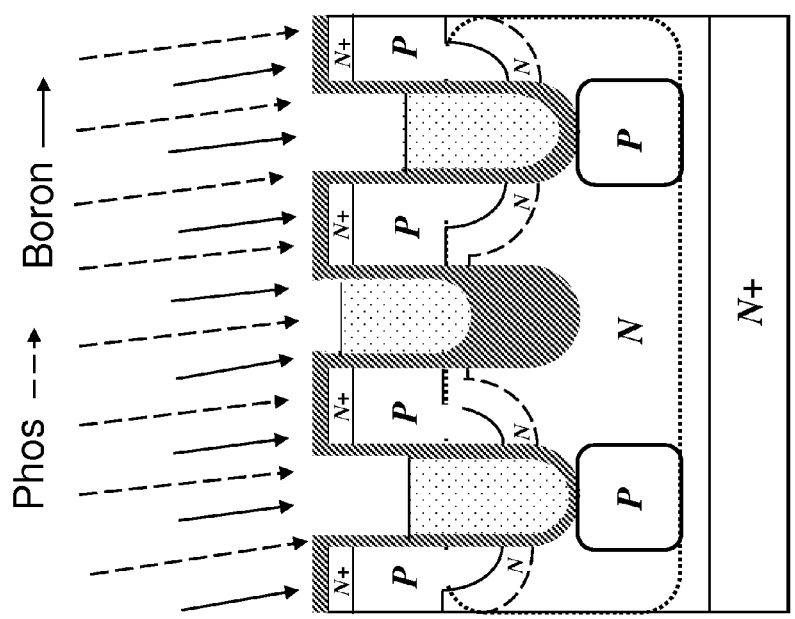
FIG. 9O (alternative to 9N). P+B Implant forming the P-body and the N buried layer

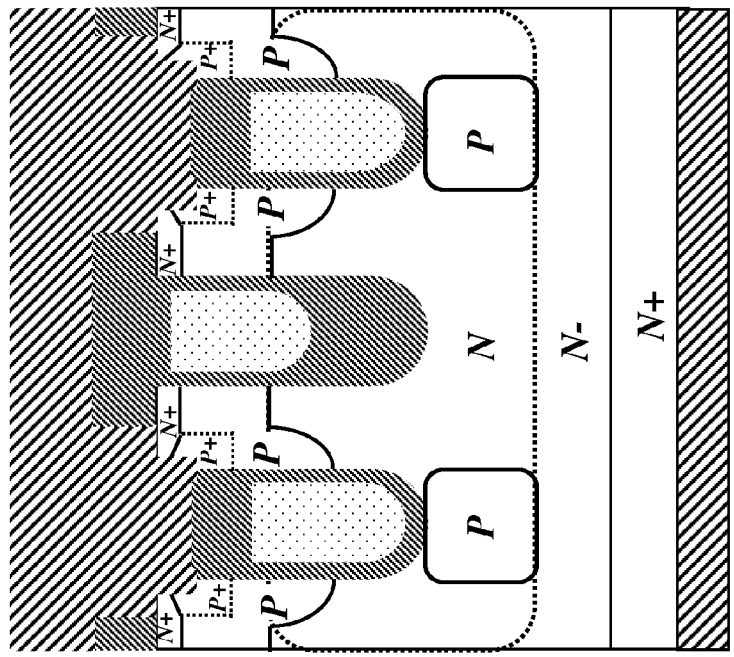
FIG. 9R. Metal Deposition
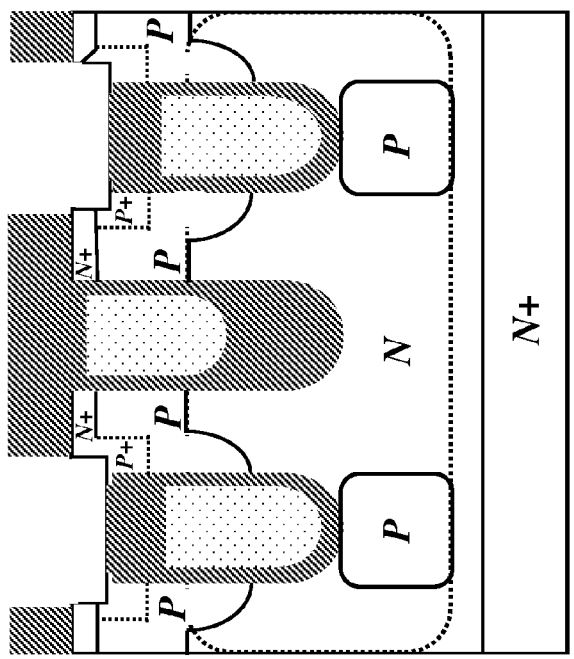
FIG. 9Q. Contact Etch, BF2 Implant

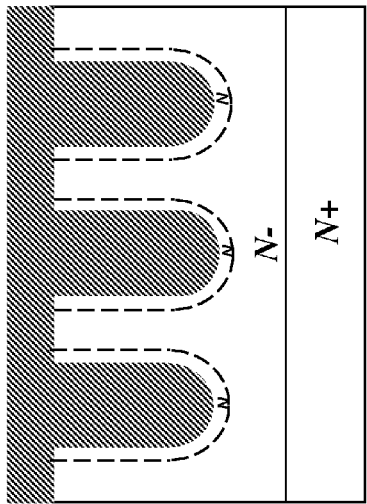
Fig. 10A. Trench Etch, Phos Implant
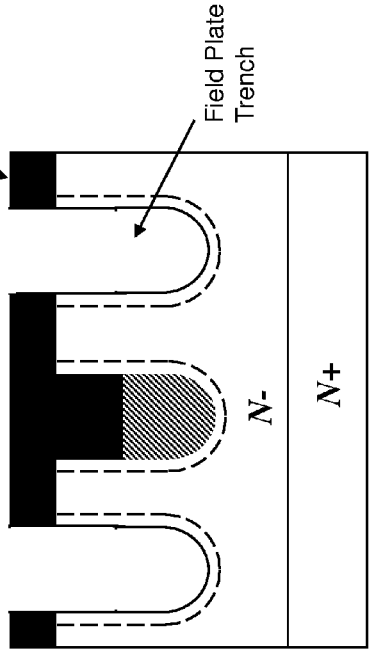
Fig. 10B. Oxide Fill
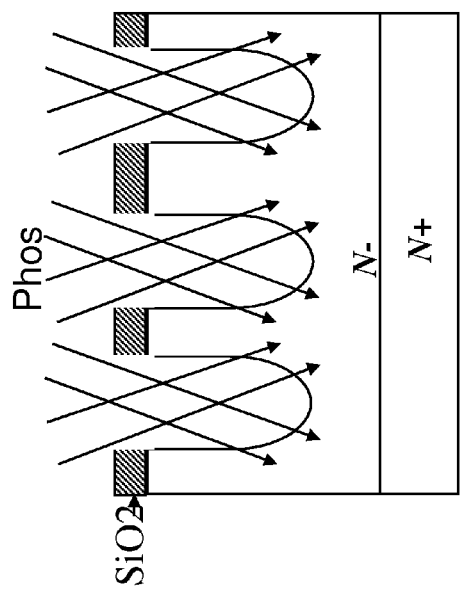
Fig. 10C. Oxide Etch Back
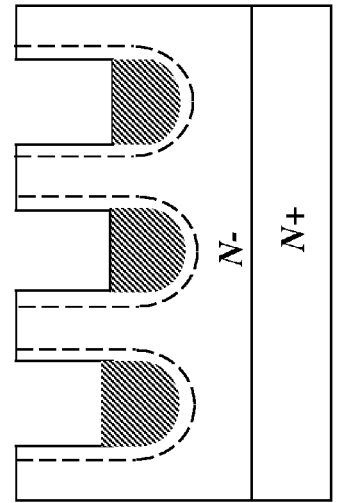
Fig. 10D. Bottom Oxide Removal

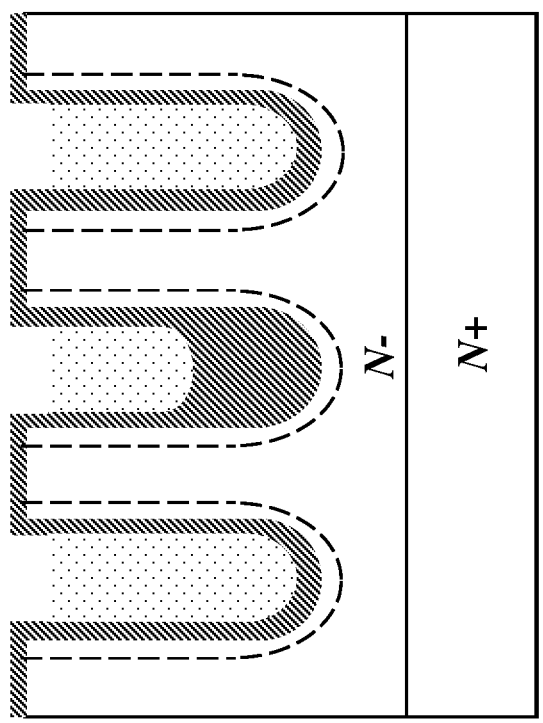
Fig. 10E. Polysilicon Deposition, Poysilicon Etch Back

POWER MOSFET WITH EMBEDDED RECESSED FIELD PLATE AND METHODS OF FABRICATION

CROSS-REFERENCE

Priority is claimed from 61/326,210 filed Apr. 20, 2010, and from 61/332,789 filed May 9, 2010, and from 61/334,573 filed May 13, 2010, all of which are hereby incorporated by reference.

BACKGROUND

The present application relates to power semiconductor devices, methods, and circuits, and more particularly to a power MOSFET with embedded recessed field plate and methods of fabrication thereof.

Power MOSFETs are widely used as switching devices in electronic applications. In order to minimize conduction power loss it is desirable that power MOSFETs have a low specific on resistance (Rsp), which is defined as the product of the on-resistance ($R_{on}$) of the MOSFET multiplied by the active die area A of the MOSFET ($R_{on}$*A). In general, the on-resistance of a power MOSFET is dominated by the channel resistance and the drift region resistances which include the channel resistance, spreading resistance and the epitaxial layer resistance.

The most common way to reduce the Rsp is to shrink the device's unit cell pitch and increase the packing density or number of cells per unit area. However, as the cell density increases, the associated intrinsic capacitances of device, such as the gate-to-source capacitance (Cgs), the gate-to-drain capacitance (Cgd), the total input capacitance (Ciss) and the total output capacitance (Coss), also increase. Therefore, for higher cell density devices, the switching power loss of device will increase. In many switching applications such as the synchronous buck dc-dc converters used in mobile products, MOSFETs are required to operate at high switching frequencies approaching the range of 1 MHz or higher. Therefore, it is required to minimize the switching or dynamic power loss governed by these capacitances.

It is also, of course, desirable to maximize the breakdown voltage of a power transistor. Increased breakdown voltage and lower specific on-resistance are both desirable. There are many trade-offs in optimizing both of these for particular applications. However, for a given specific on-resistance, higher breakdown voltage is generally desirable, and for a given breakdown voltage, lower specific on-resistance is generally desirable.

Another generally desirable property is ruggedness: if a device sees an overvoltage beyond its limits, it is desirable that the device should become functional again after that.

Another desirable property, in most cases, is switching speed. This depends on various factors, but one of them is the amount for Reverse Recovery charge $Q_{RR}$ (per unit area at the surface) of the body-drain diode which must be removed to turn the device off.

SUMMARY

The present application discloses new approaches to vertical transistor structures and methods. In general, gate trenches, where a gate electrode controls inversion of an adjacent semiconductor body, are accompanied by embedded recessed field plate trenches, containing a field plate which is not connected to the source metallization at that particular location. In many embodiments, the field plates are deeper than the gate electrodes, both at their tops and at their bottoms. (In many embodiments, the field plate will be contacted outside of an array or subarray of active devices.)

The disclosed innovations, in various embodiments, provide one or more of at least the following advantages. However, not all of these advantages result from every one of the innovations disclosed, and this list of advantages does not limit the various claimed inventions.

Low specific on-resistance Rsp
Low gate-drain charge Qgd
Low gate charge Qg
Low reverse recovery charge Qrr
Improved body diode reverse recovery characteristics
Optimized body profile
Optimized body contact profile
Improved ruggedness
Higher breakdown voltage

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 4A shows potential contours of one specific implementation of the device of FIG. 3A at breakdown.

FIG. 4B shows potential contours of one specific implementation of the device of FIG. 2J at breakdown.

FIG. 6 shows a simulation of a structure like that of FIG. 2C.

FIG. 7A shows a more complete simulation of a structure like that of FIG. 2C, including a graphic indication of net doping levels.

FIG. 7B is a plot of doping levels in the structure of FIG. 7A.

FIGS. 9A-9R show another example of a process sequence, including optional alternatives.

FIGS. 10A-10E show examples of a modified process flow.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

Figure 1A:
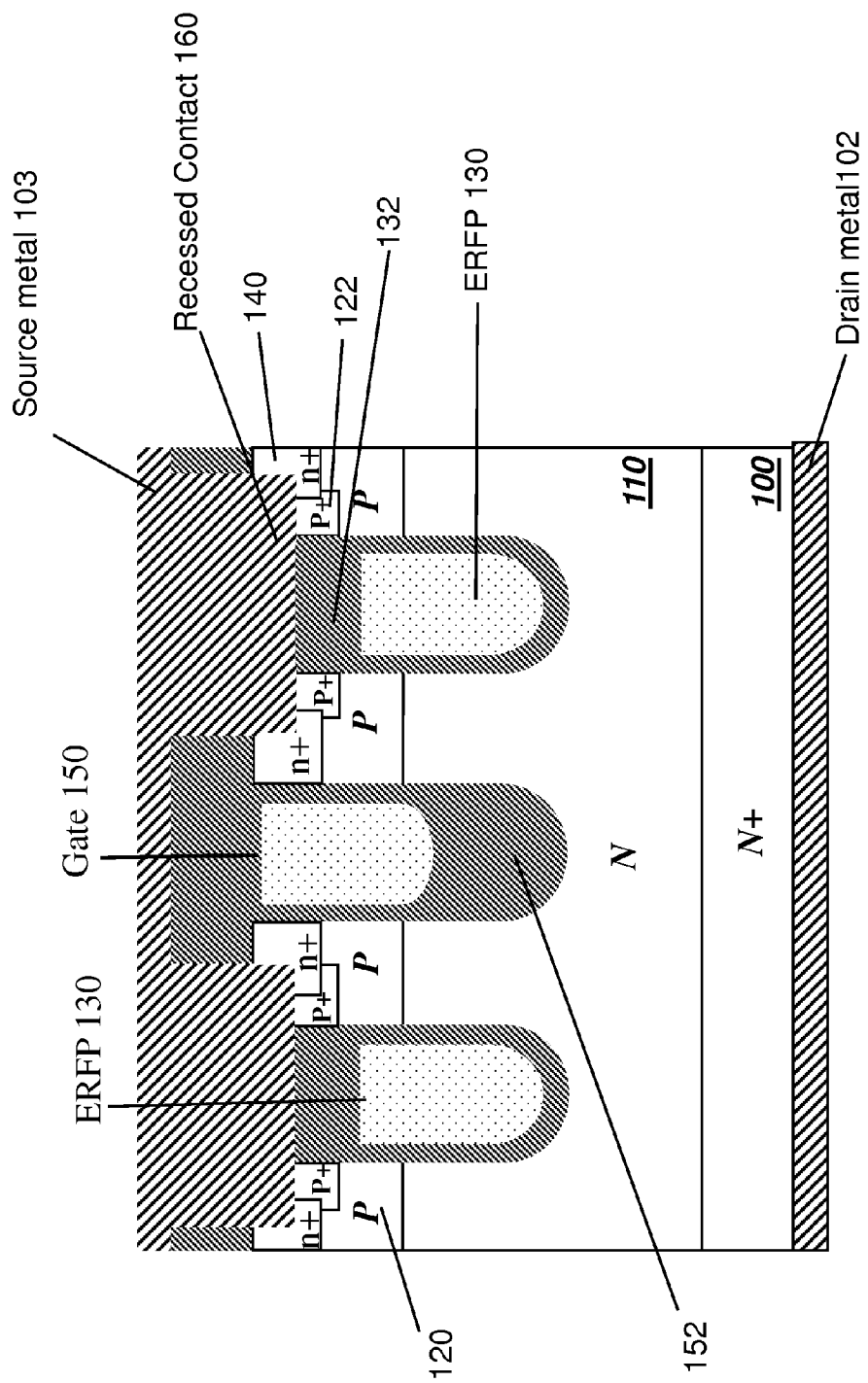
FIG. 1A schematically shows an example of an n-channel MOSFET basic cell structure.

In one example, an n-channel MOSFET basic cell structure is shown in FIG. 1A. The new structure has an Embedded Recessed Field Plate (ERFP) electrode 130 and a recessed source metal contact 160. A dielectric layer 132 (e.g. of silicon dioxide) is sandwiched between a recessed source metal contact 160 and the ERFP electrode 130. The recessed metal contact 160 makes contact to the n+ source region 140 and p+ body contact region 122. Both the recessed source contact 160 and ERFP electrode are positioned in the same general location, i.e. at the ERFP trench. Note, however, that in this example, the width KK of the source contact 160 (measured between the two geometric lines $K_1$ and $K_2$) is significantly larger than the width TT of the ERFP trench (measured between the two geometric lines $T_1$ and $T_2$). As will be seen in the process description below, the p+ body contact region 122 can advantageously be self-aligned to the trench itself, rather than to the source contact metal 160. This makes it easier for the recessed source contact 160 to extend laterally to the n+ source region 140, without having the acceptor dopants of the p-type body contact diffusion 122 counter doping the donor dopants in the source region 140, or reducing the charge of the on-state inversion layer in the body region 120.

The depth of the contact to source and to the p+ body contact region is affected by the depths of source and body regions, both of which are relatively shallow; however, the vertical separation between those contact locations and the embedded field plate 130, in this example, permits the ERFP to extend deeper than might otherwise be easily achievable.

Gate electrode 150 (typically n+ polysilicon, with or without cladding) is preferably located in its own trench. The ERFP and gate trenches can be of substantially equal depth, as shown, or can have different depths. Both, in this example, extend down through the p-type body region 120 into an n-type epitaxial layer 110 which overlies an n+ substrate 100.

The sidewalls of the gate and ERFP trenches are lined with an insulating material such as silicon dioxide ($SiO_2$). Preferably the gate trench also contains a thick bottom oxide 152, which helps to minimize the overlap of the Gate electrode 150 and drift region 110, and which thereby helps reduce the gate-drain capacitance $C_{gd}$. The gate and ERFP electrodes (150 and 130) are formed of conductive materials such as doped polysilicon. The ERFP electrode 130 is deeper than the gate electrode 150, both at top and bottom. The ERFP electrode 130 can be independently biased or (more preferably) connected to the source electrode as described below. It should also be noted that the ERFP electrode can be left floating.

Figure 1B:
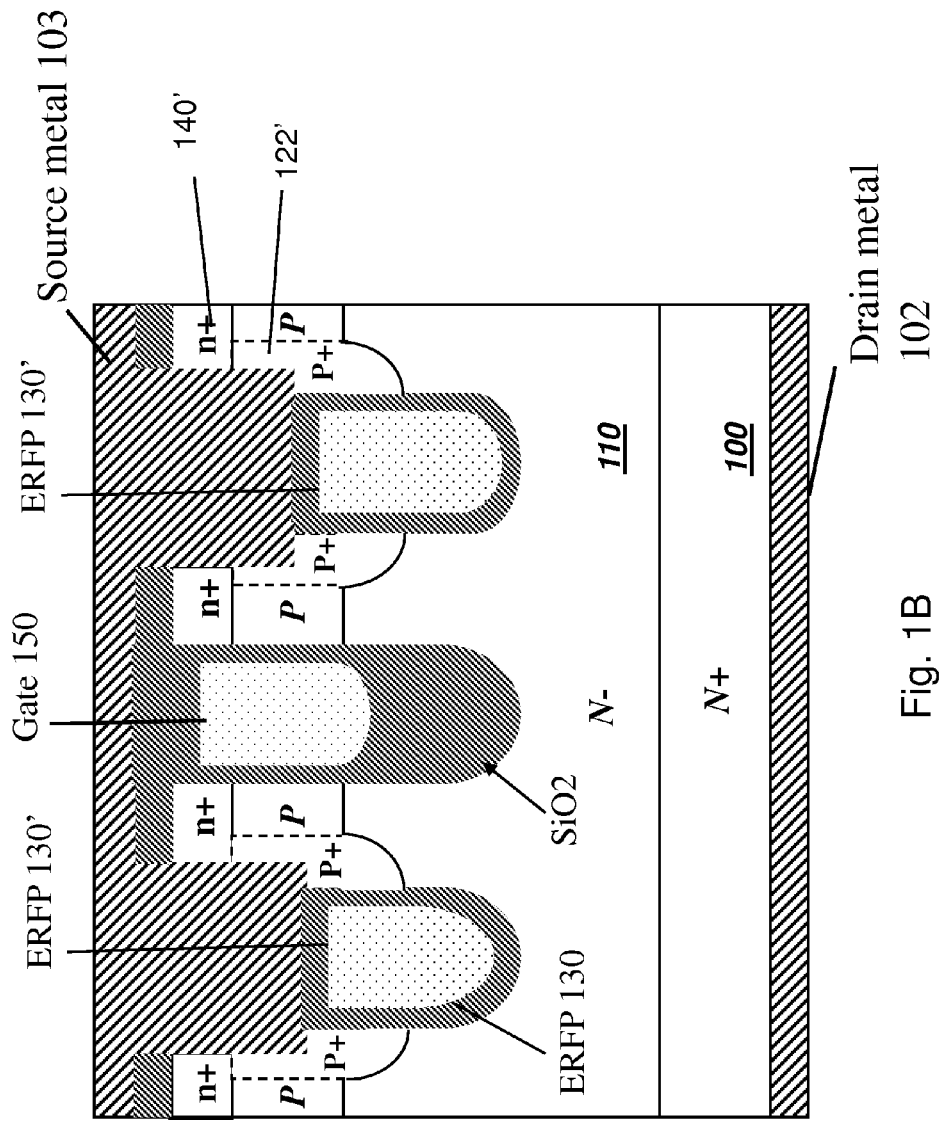
FIG. 1B schematically shows another example of a device structure.

FIG. 1B shows another example, in which the source region has been implemented as a uniform n+ layer 140'. Note that the metal in the recessed contact 160 extends completely through the depth of the source region, so that the contact to source is entirely vertical.

In this example, the p+ body contact regions 122' extend more deeply than the body region 120. The deeper p+ regions provide better immunity to snap-back or secondary breakdown characteristics and improve device ruggedness.

Figure 1C:
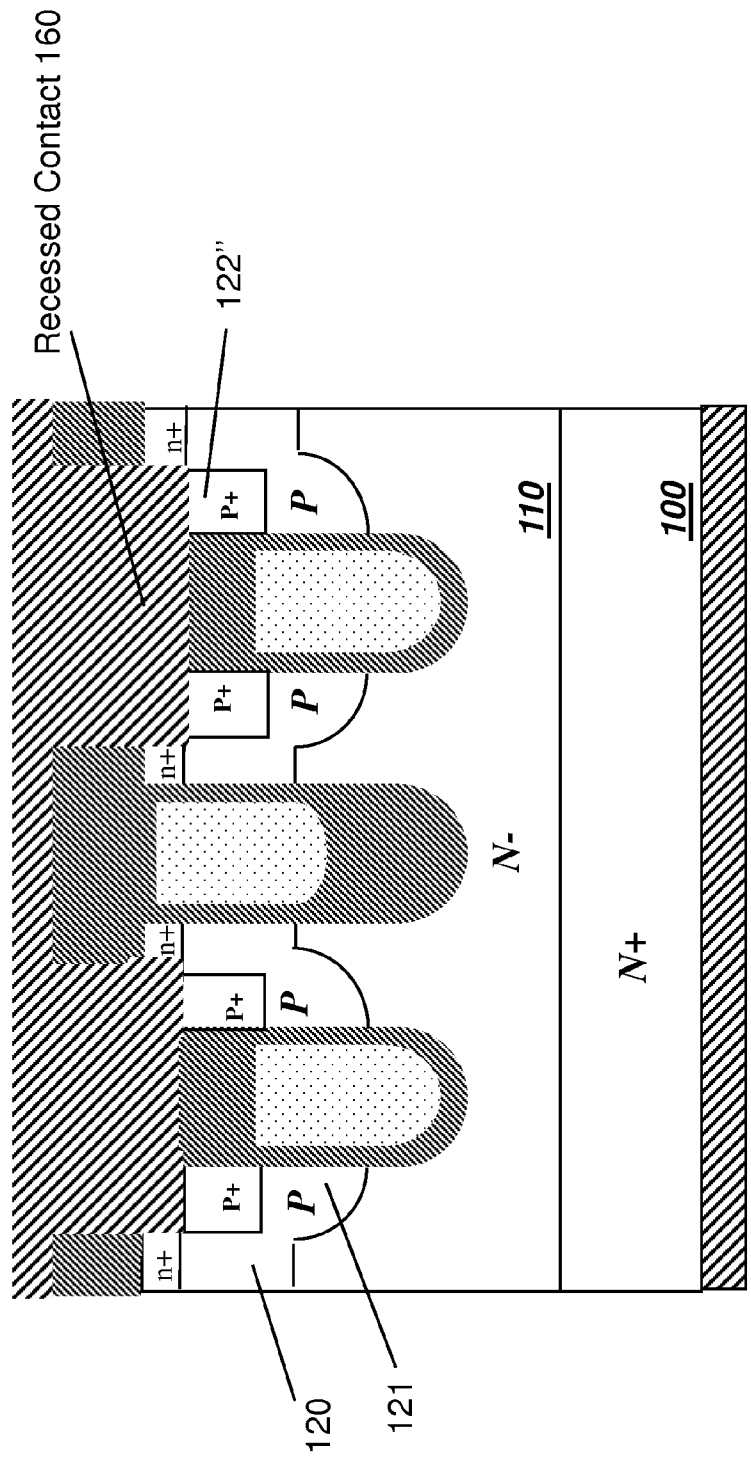
FIG. 1C schematically shows another example of a device structure.

FIG. 1C shows another example in which the body contact region 122" has been formed by a vertical implant through the opening for the recessed contact 160.

Note that, in this example, the body region 120 includes a downward extension 121 next to the ERFP trench. A process implementation which achieves this will be described below.

Figure 1D:
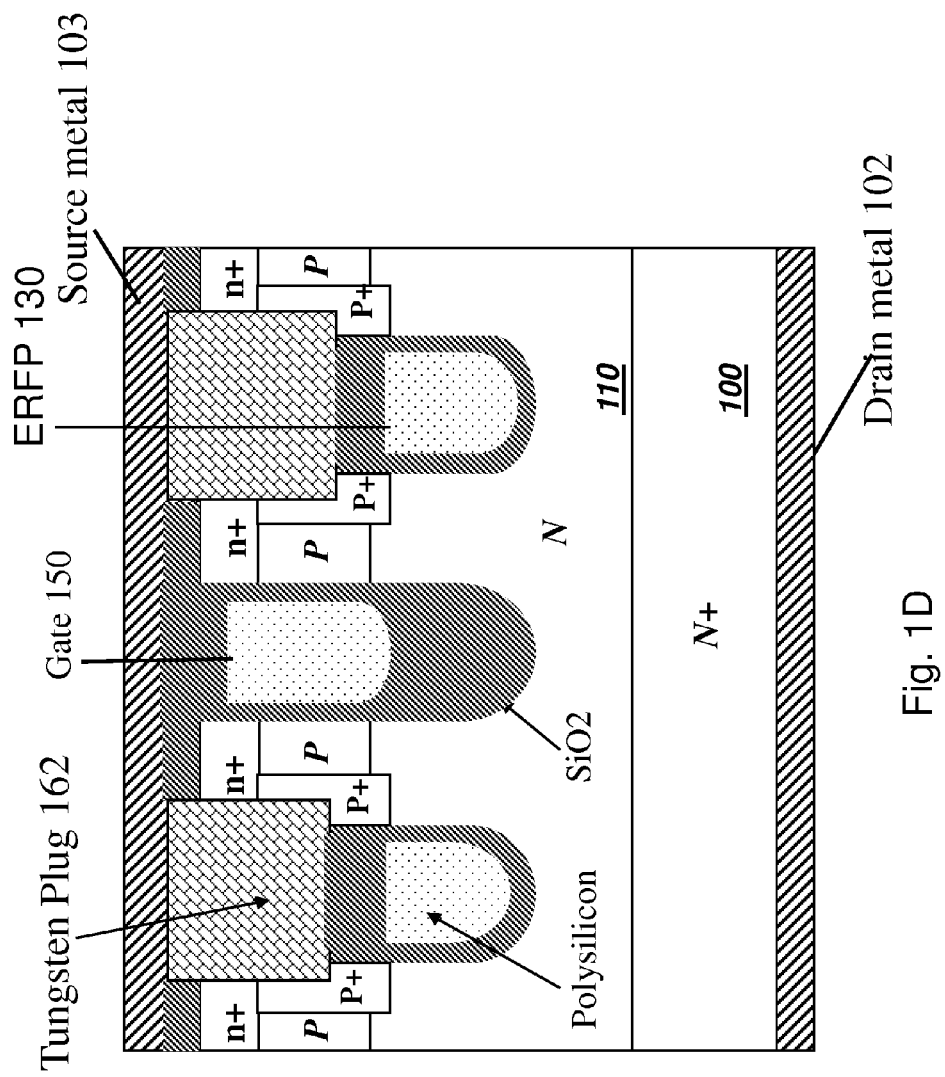
FIG. 1D schematically shows another example of a device structure.

FIG. 1D shows another example in which the recessed contact region 160 is filled with a plug 162 of conducting material such as tungsten. Note that the tungsten plug contacts the source region and the source metal. Note also that the source metal can be more nearly planar in this example.

Figure 1E:
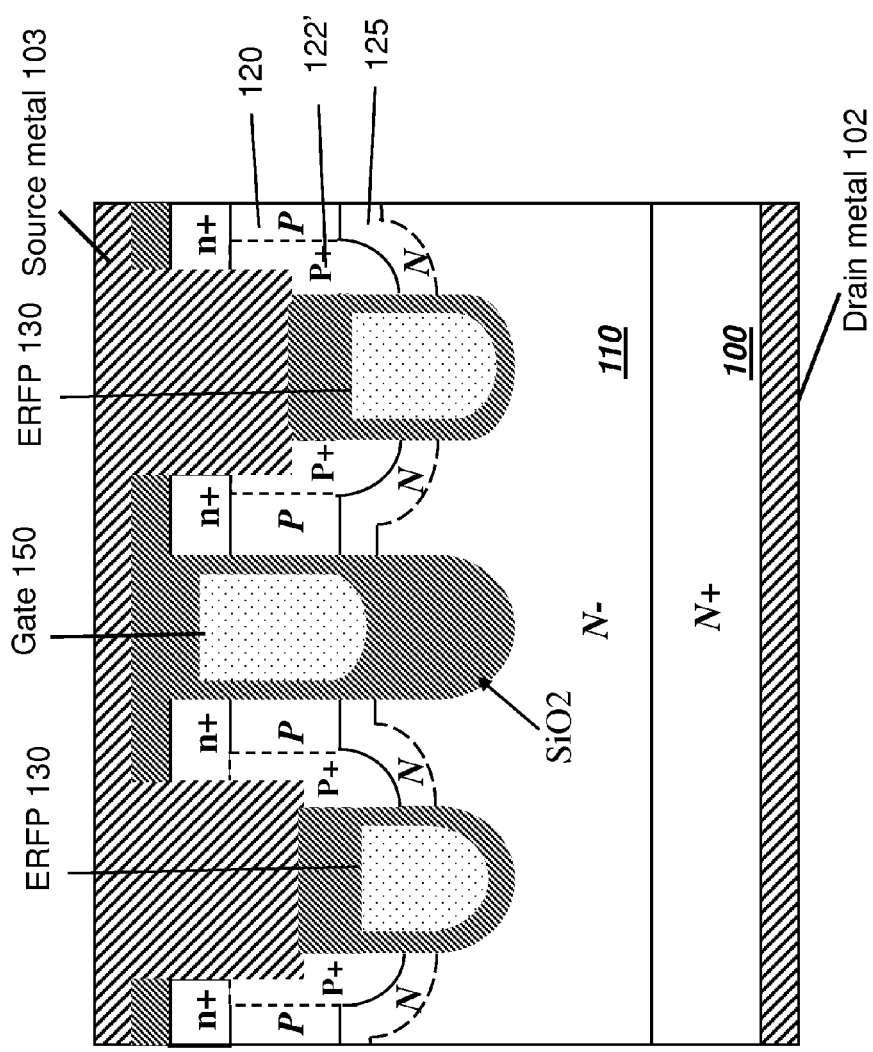
FIG. 1E schematically shows another example of a device structure.

FIG. 1E shows another example, which is somewhat similar to that of FIG. 1B, except the p-body 120 and the deep p+ 122' are surrounded by a self-aligned region 125 of enhanced n-type doping. This region 125 improves reverse recovery characteristics, by reducing the stored charge $Q_{RR}$.

Figure 1F:
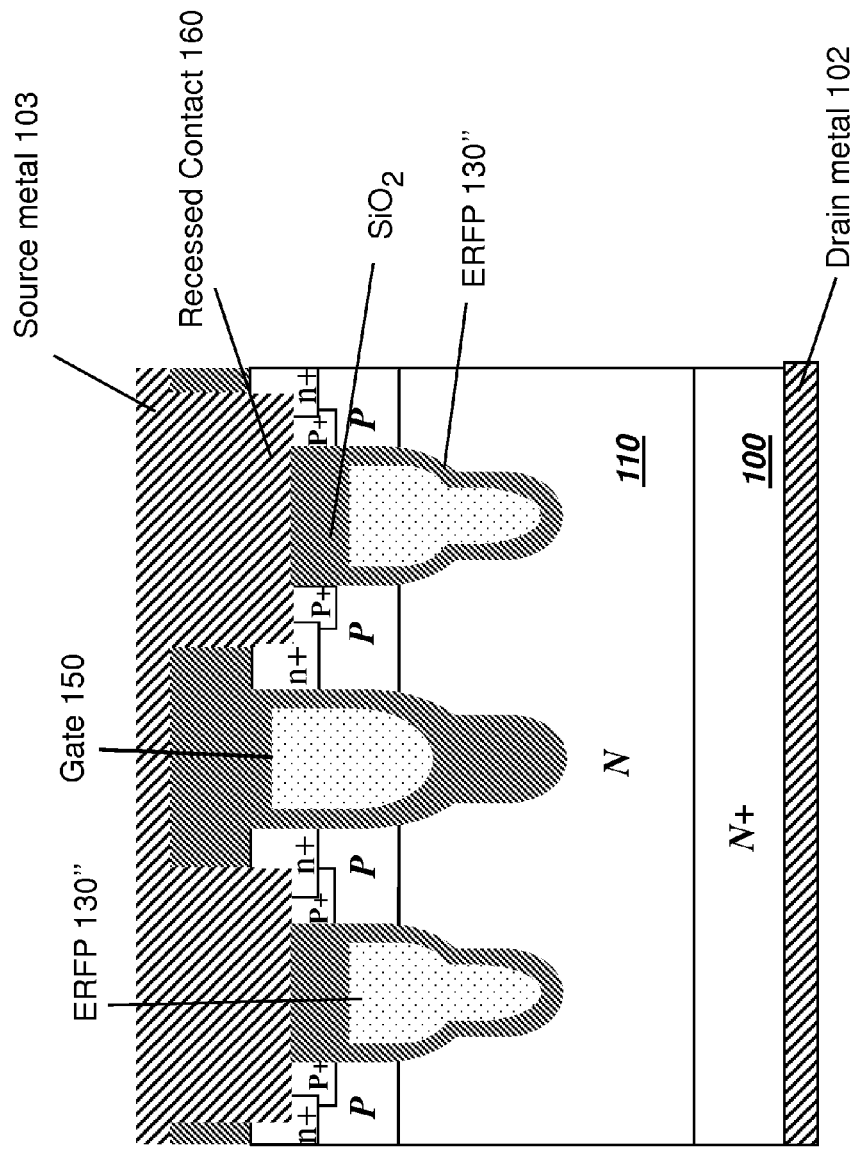
FIG. 1F schematically shows another example of a device structure.

FIG. 1F shows yet another example in which the gate trench and embedded field plate trench are with variable widths formed with a smooth transition region structure 130'''.

Figure 1G:
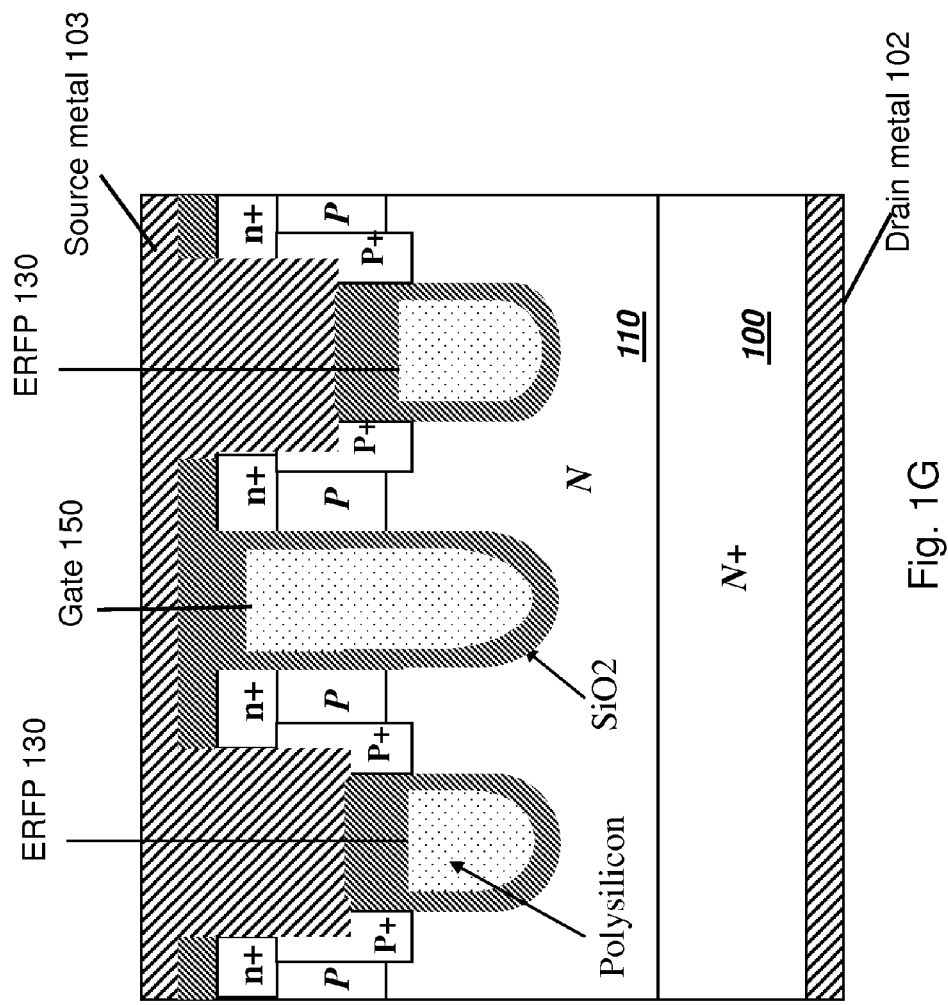
FIG. 1G schematically shows another example of a device structure.

FIG. 1G shows yet another example in which the gate 150' extends just as deeply as the embedded field plate. This structure is simpler to fabricate as it does not require a thick bottom oxide layer formation.

Figure 1H:
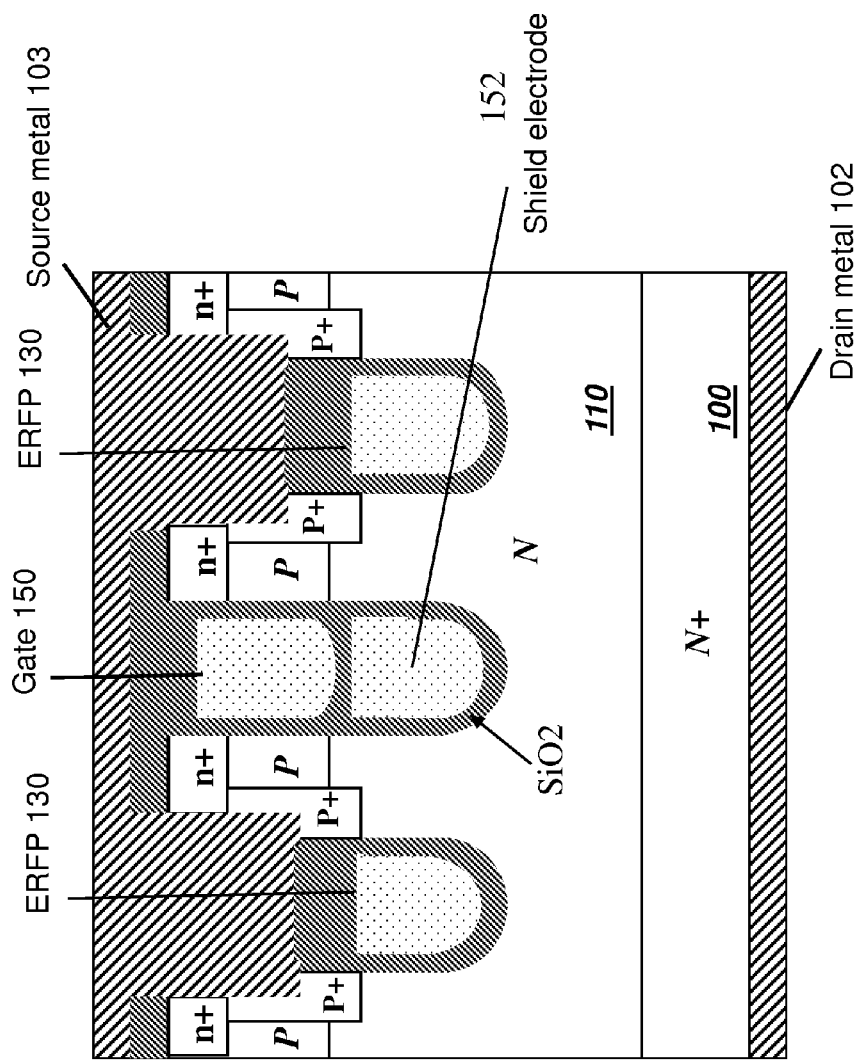
FIG. 1H schematically shows another example of a device structure.

FIG. 1H shows yet another example in which a shield electrode 152 lies below the gate electrode. This reduces gate-drain coupling. The shield electrode 152 can be tied to the same potential as the embedded field plate, or to a different potential, or less preferably can even be left floating. Furthermore, the shield electrode 152 can be formed at the same step when forming the ERFP electrode 130 which simplifies the fabrication process.

Figure 1I:
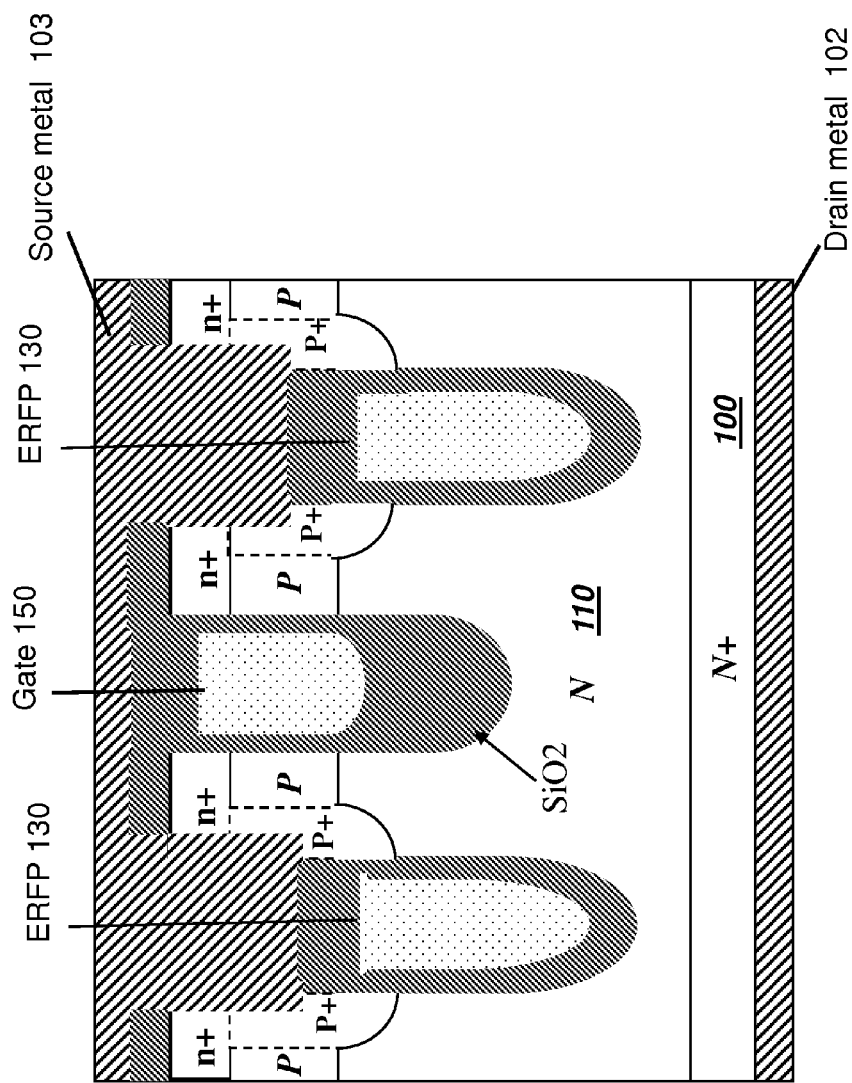
FIG. 1I schematically shows another example of a device structure.

FIG. 1I shows yet another example in which the embedded field plate ERFP trench 130 is deeper than gate trench 150'. This structure extends the breakdown voltage capability of the structure to higher values than those previously shown.

Figure 2A:
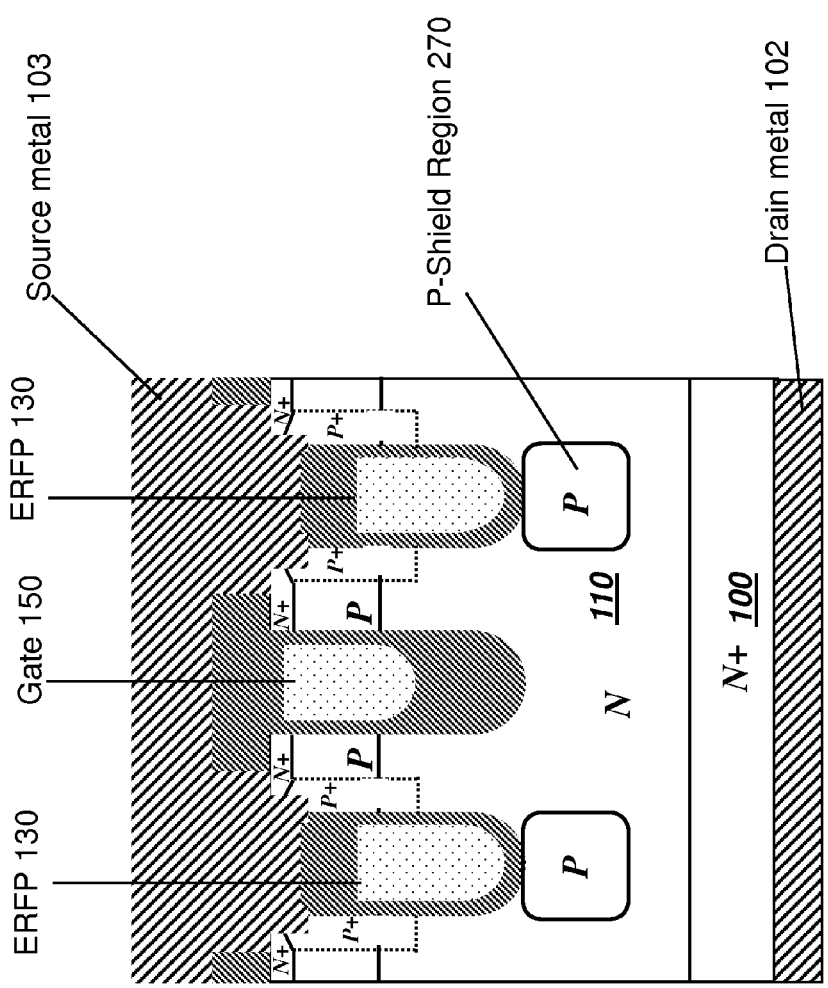
FIG. 2A schematically shows another example of a device structure.

FIG. 2A shows another innovative example. In this device, an additional implant has been performed (as described below) before the ERFP trenches are filled. This has resulted in P-type shield regions 270 at or below the bottom of the ERFP trenches. The P shield regions can be floating or connected to the source metal through a deep P region (not shown). The P shield regions 270 shape the depletion contours at breakdown, so that more voltage drop occurs across the drift region before the body region is depleted through.

Figure 2B:
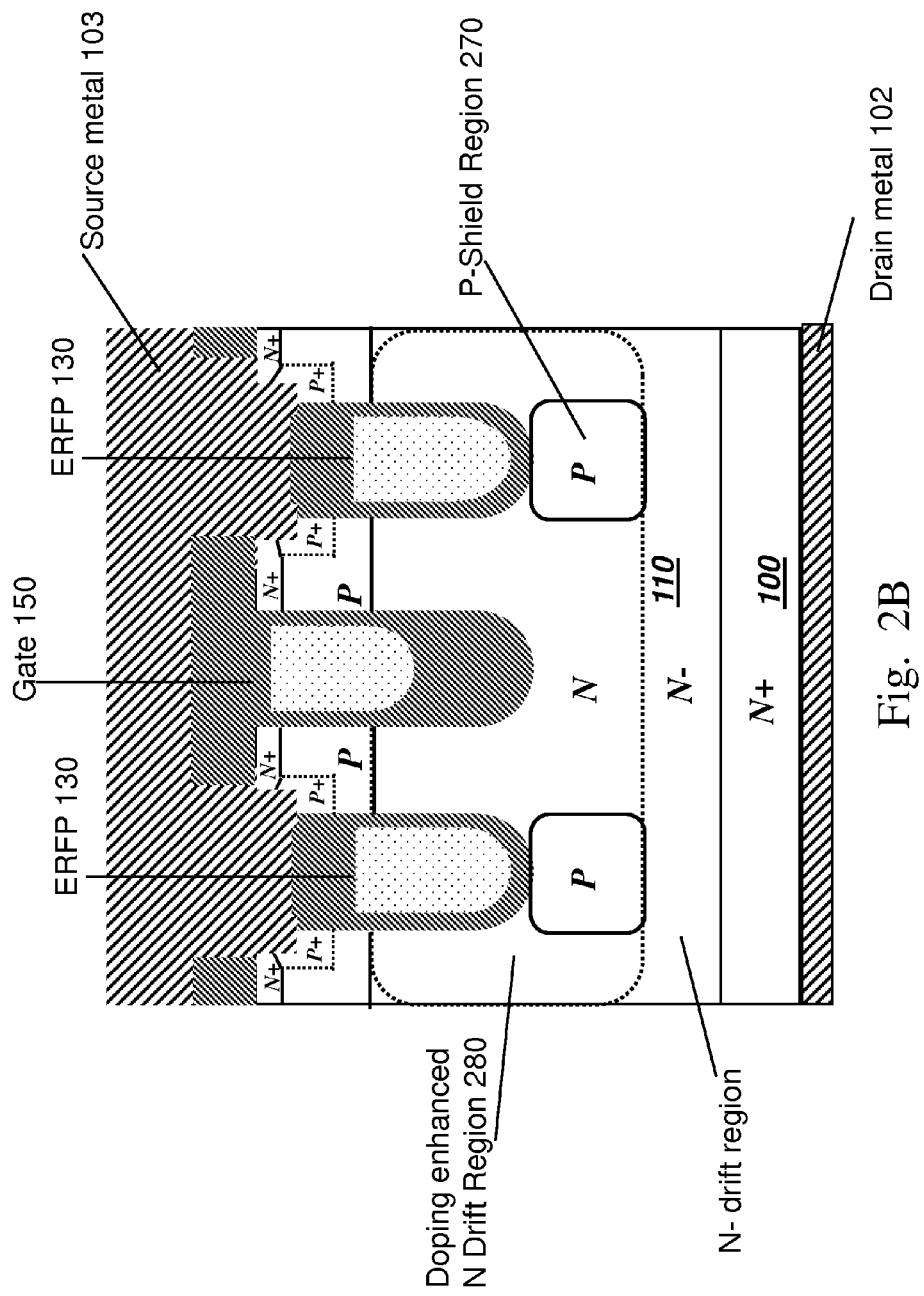
FIG. 2B schematically shows another example of a device structure.

FIG. 2B shows another innovative example. This device includes not only p-type shield regions 270 at or below the bottom of the ERFP trenches, but also a locally n-type doping enhancement 280 which increases the on-state conductivity of N drift region on top of a lightly doped N drift region. This doping enhancement 280 trades off some of the increased breakdown voltage which results from the p shield region and the embedded field plate for better on-state conductivity.

Figure 2C:
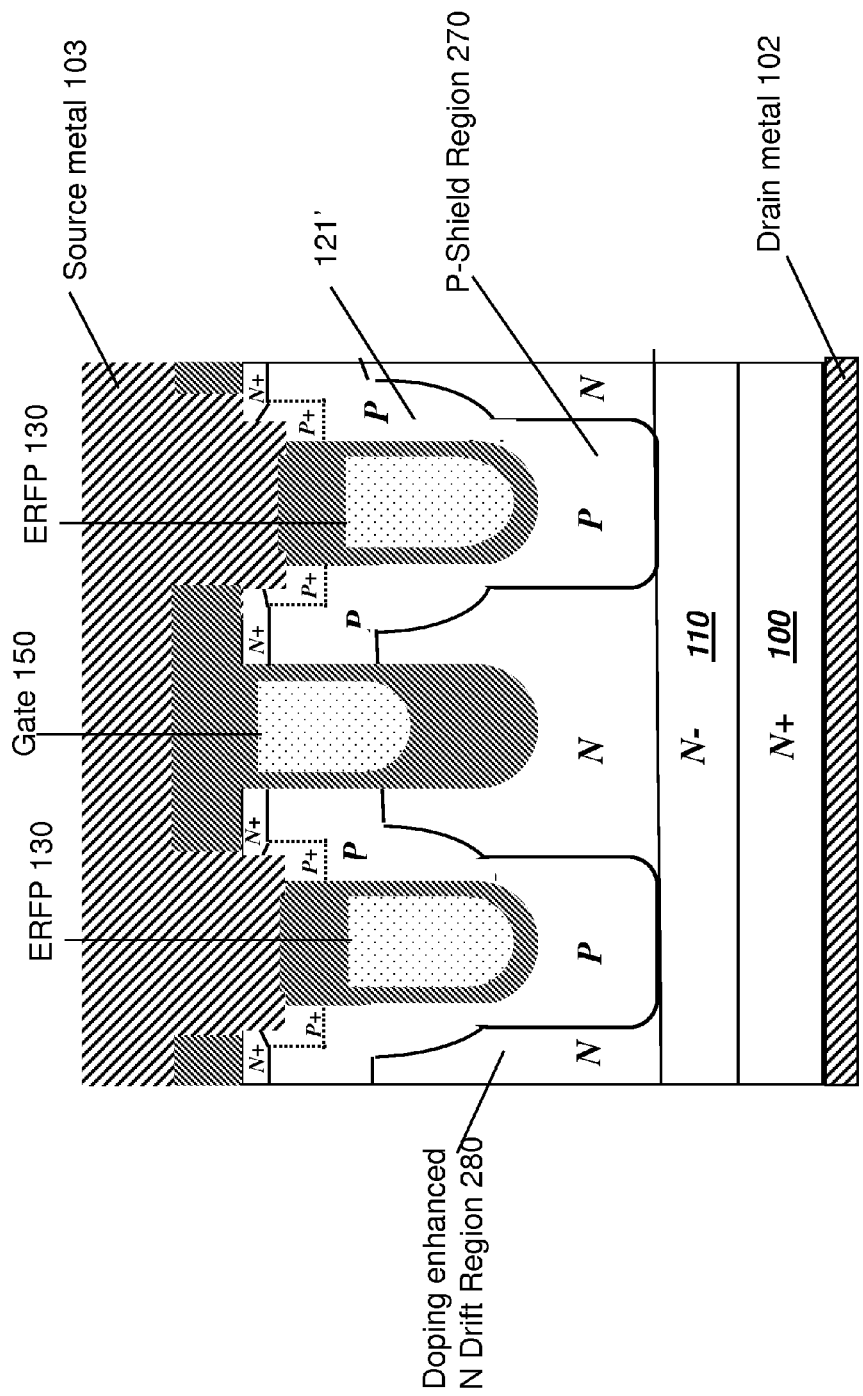
FIG. 2C schematically shows another example of a device structure.

FIG. 2C shows another example, where the body has downward extensions 121, and these extend right down to the p-type shield regions 270. This provides a straightforward way to connect the p-shield region 270 to the source metal through the p-body extension region 121' and P+ contact. Electrically, this structure can be modeled as a resistive connection between the deep p and the body. As discussed above, the doping enhancement 270 helps provide on-resistance.

This example is most advantageous for low- or medium voltage devices, e.g. with operating voltages of 30V-200V.

Figure 2D:
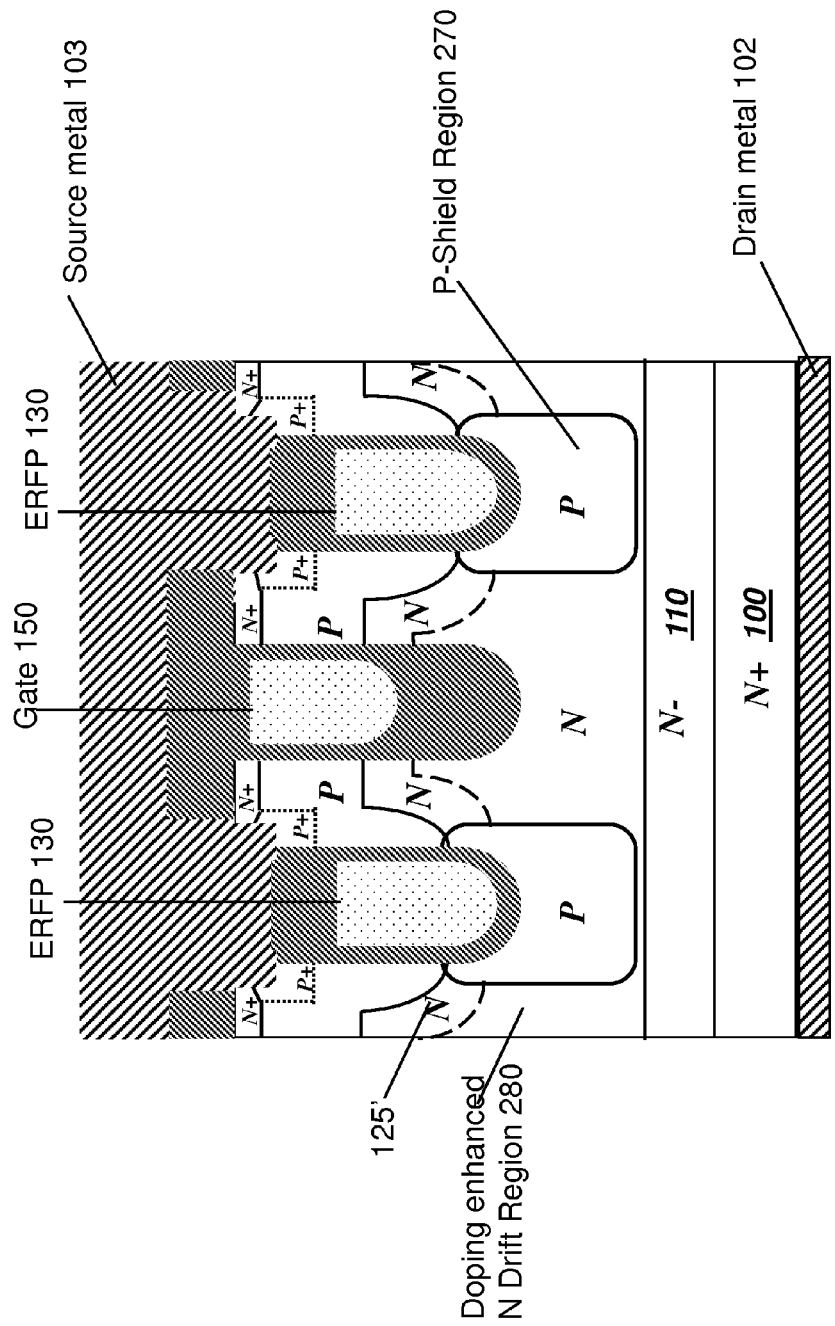
FIG. 2D schematically shows another example of a device structure.

FIG. 2D shows another example, which is generally somewhat similar to that of FIG. 2C, except that a self-aligned n-region 125' is used instead of (or in addition to) the n-type enhancement 270.

Figure 2E:
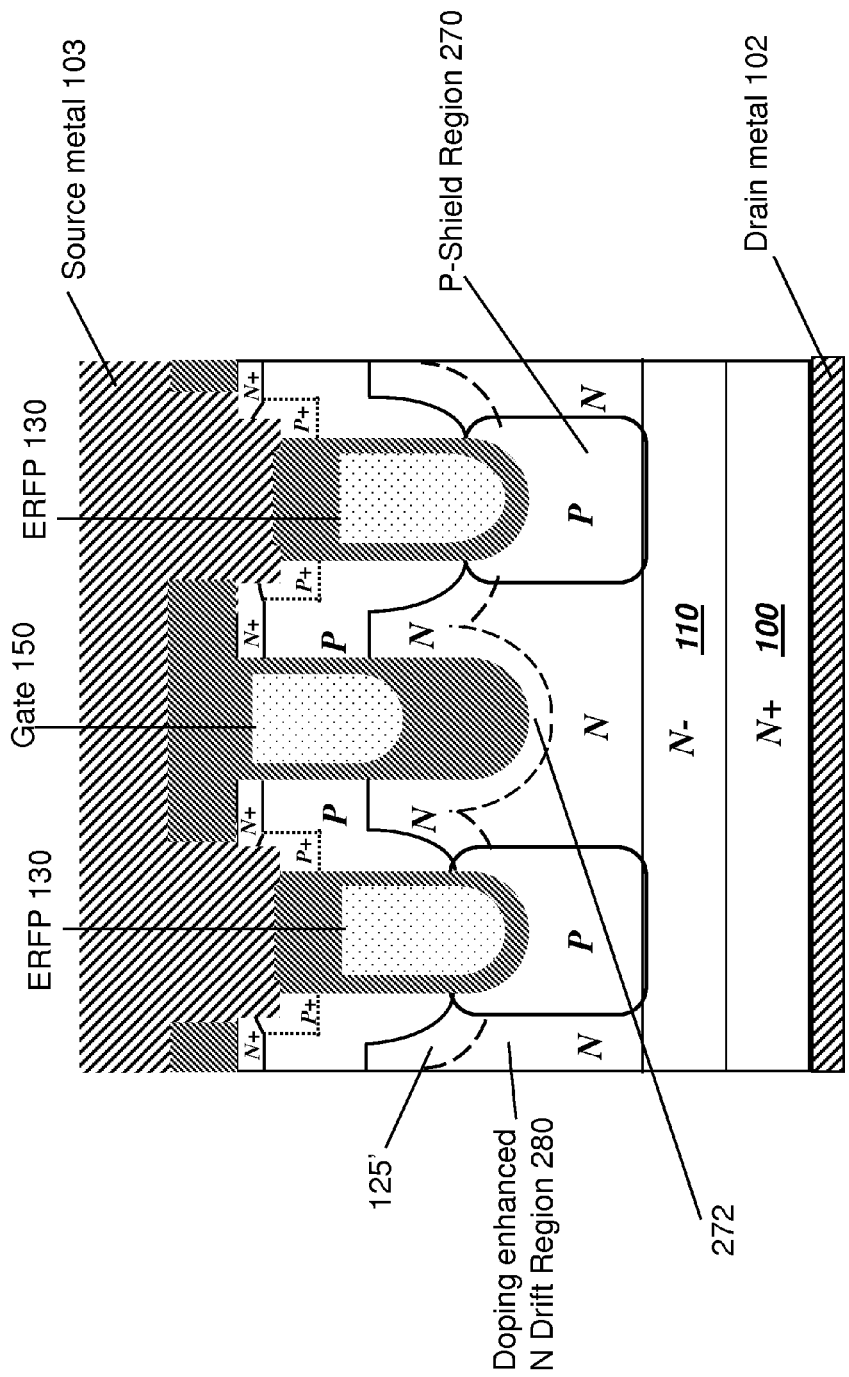
FIG. 2E schematically shows another example of a device structure.

FIG. 2E shows another example, which is generally somewhat similar to that of FIG. 2C, except that a self-aligned n-region 125' is used instead of (or in addition to) the n-type enhancement 270, and an additional self-aligned n-type enhancement 272 is self-aligned to the gate trench.

Figure 2G:
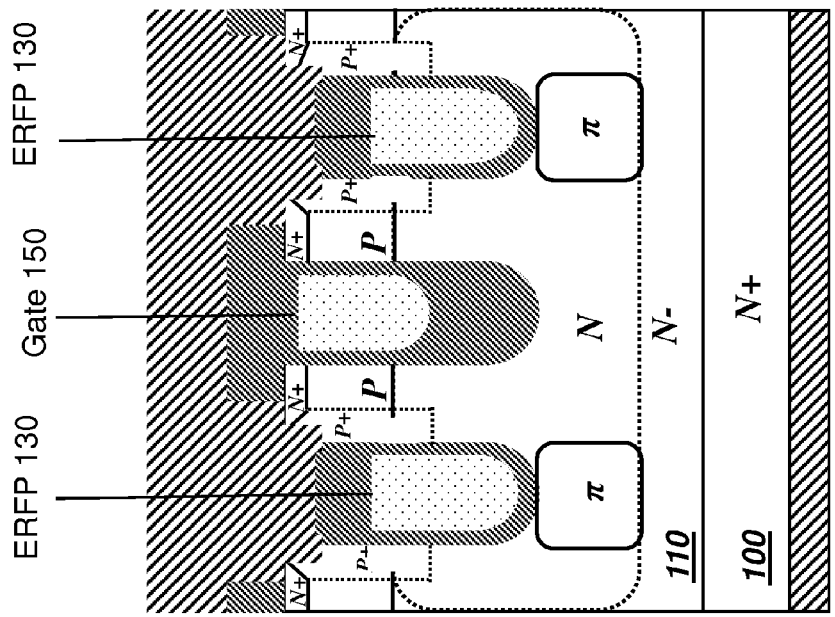
FIG. 2G schematically shows another example of a device structure.
Figure 2F:
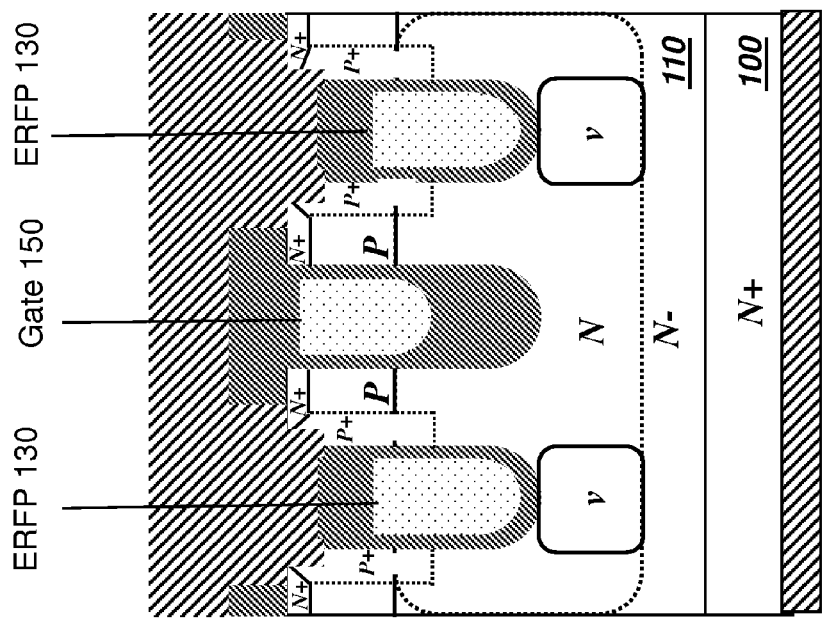
FIG. 2F schematically shows another example of a device structure.

FIG. 2F shows another example, which is generally somewhat similar to that of FIG. 2A, except that the shield region is not a p-type region, but instead is a near-intrinsic n-type region. (Such near-intrinsic n-type region can conventionally be indicated with the Greek letter nu, and can have a doping of $10^{15}$ cm$^{-3}$ or less.)

FIG. 2G shows another example, which is generally somewhat similar to that of FIG. 2A, except that the shield region is a near-intrinsic p-type region. (Such near-intrinsic n-type region can conventionally be indicated with the Greek letter pi, and can have a doping of $10^{15}$ cm$^{-3}$ or less.)

Figure 2H:
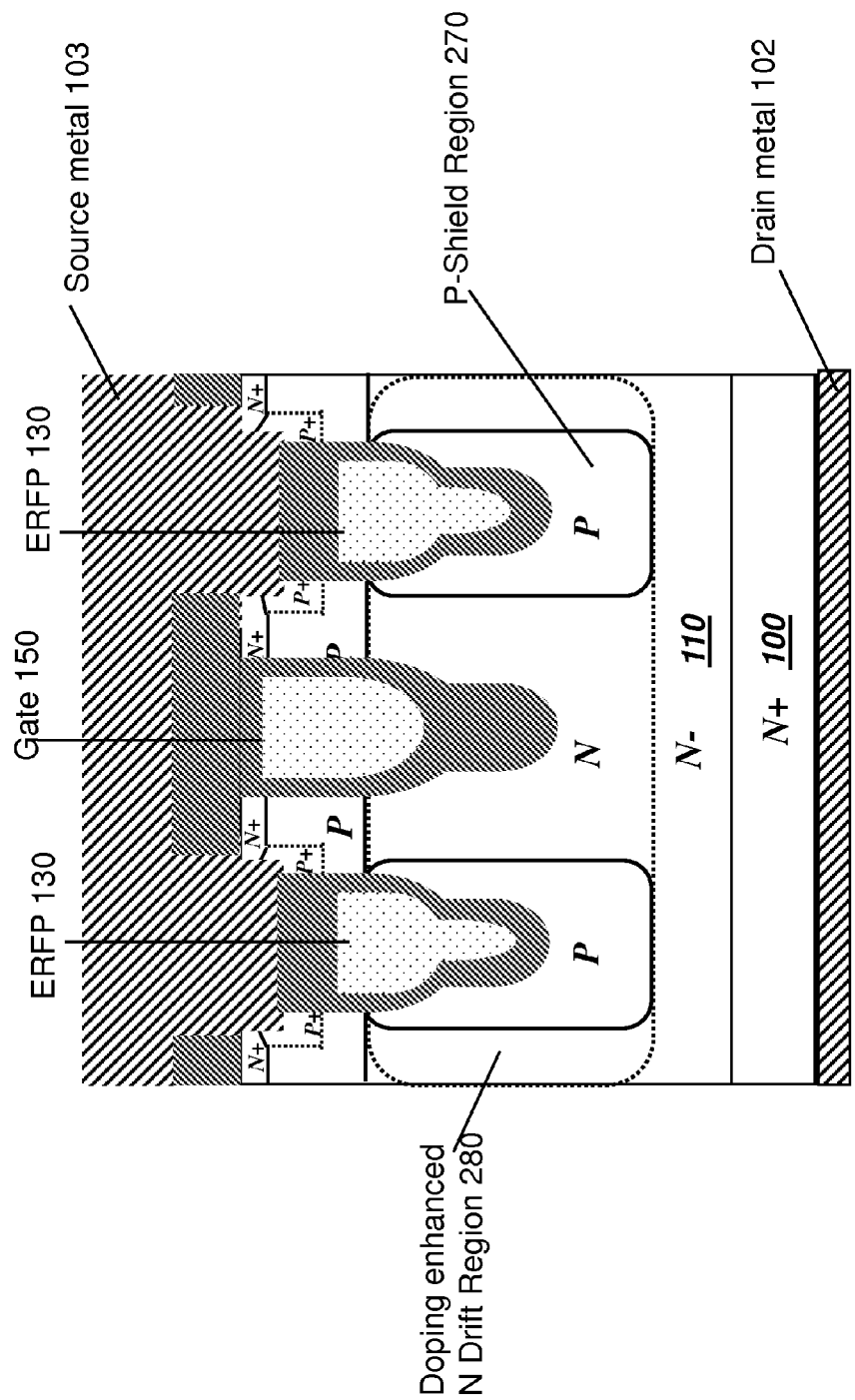
FIG. 2H schematically shows another example of a device structure.

FIG. 2H shows another example, which is generally somewhat similar to that of FIG. 2B, except that the field plate is with variable trench width with a smooth transition region. Note that the oxide surrounding the ERFP is thicker than the gate oxide and therefore can withstand a higher breakdown voltage.

Figure 2I:
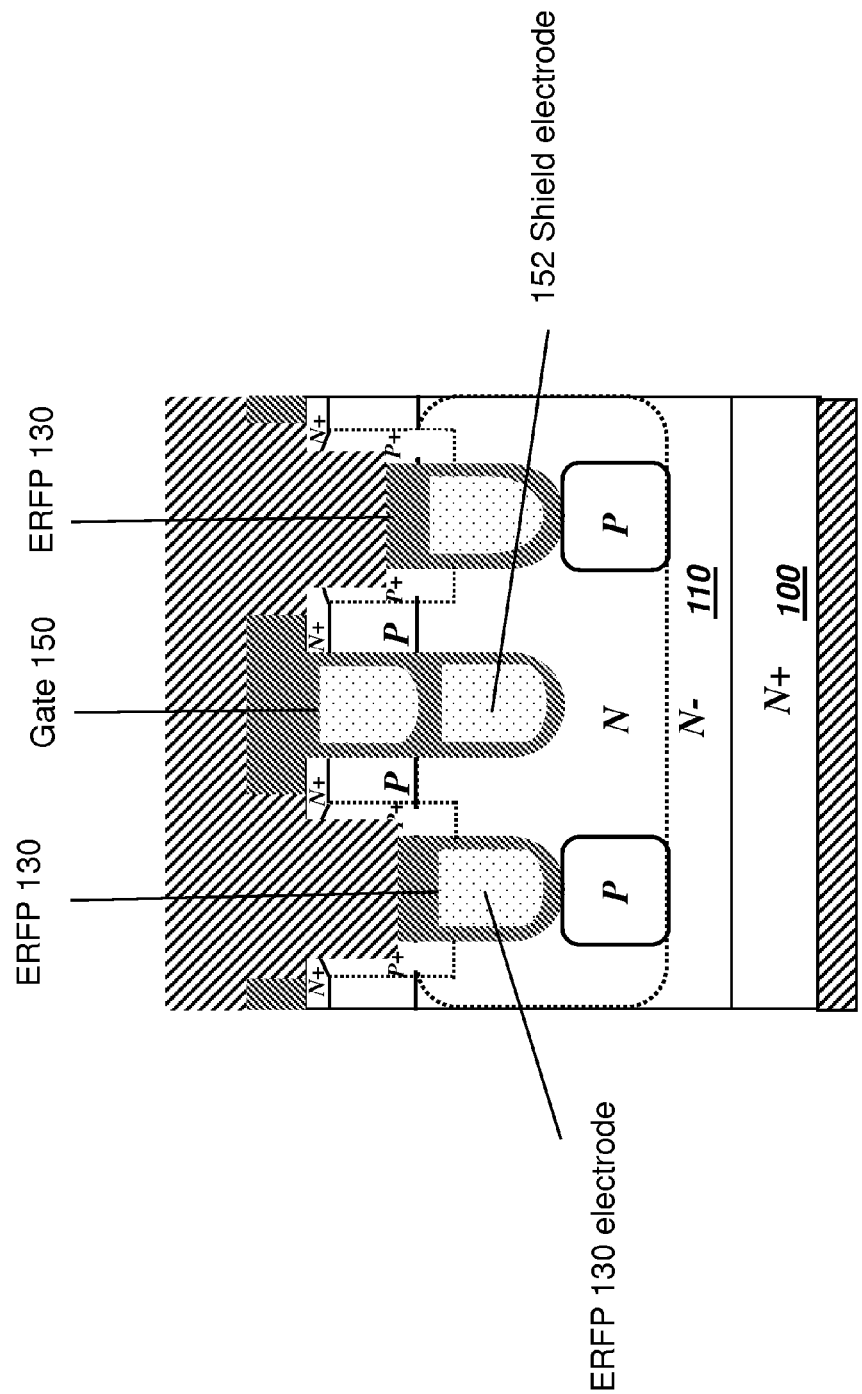
FIG. 2I schematically shows another example of a device structure.

FIG. 2I shows yet another example, which is generally somewhat similar to that of FIG. 2A, except that a shield electrode 152 lies below the gate electrode. This reduces gate-drain coupling. The shield electrode 152 can be tied to the same potential as the embedded field plate, or to a different potential, or less preferably can even be left floating.

Figure 2J:
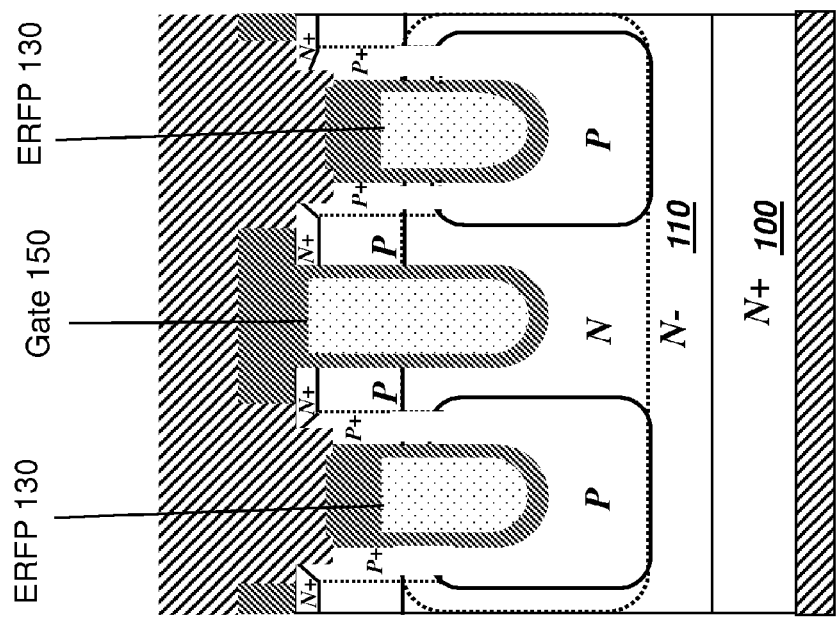
FIG. 2J schematically shows another example of a device structure.

FIG. 2J shows yet another example, which is generally somewhat similar to that of FIG. 2A, except that the gate 150' extends just as deeply as the embedded field plate. This provides a device which can be built with a simpler fabrication process, but which has an increased gate-drain capacitance Cgd.

Figure 2K:
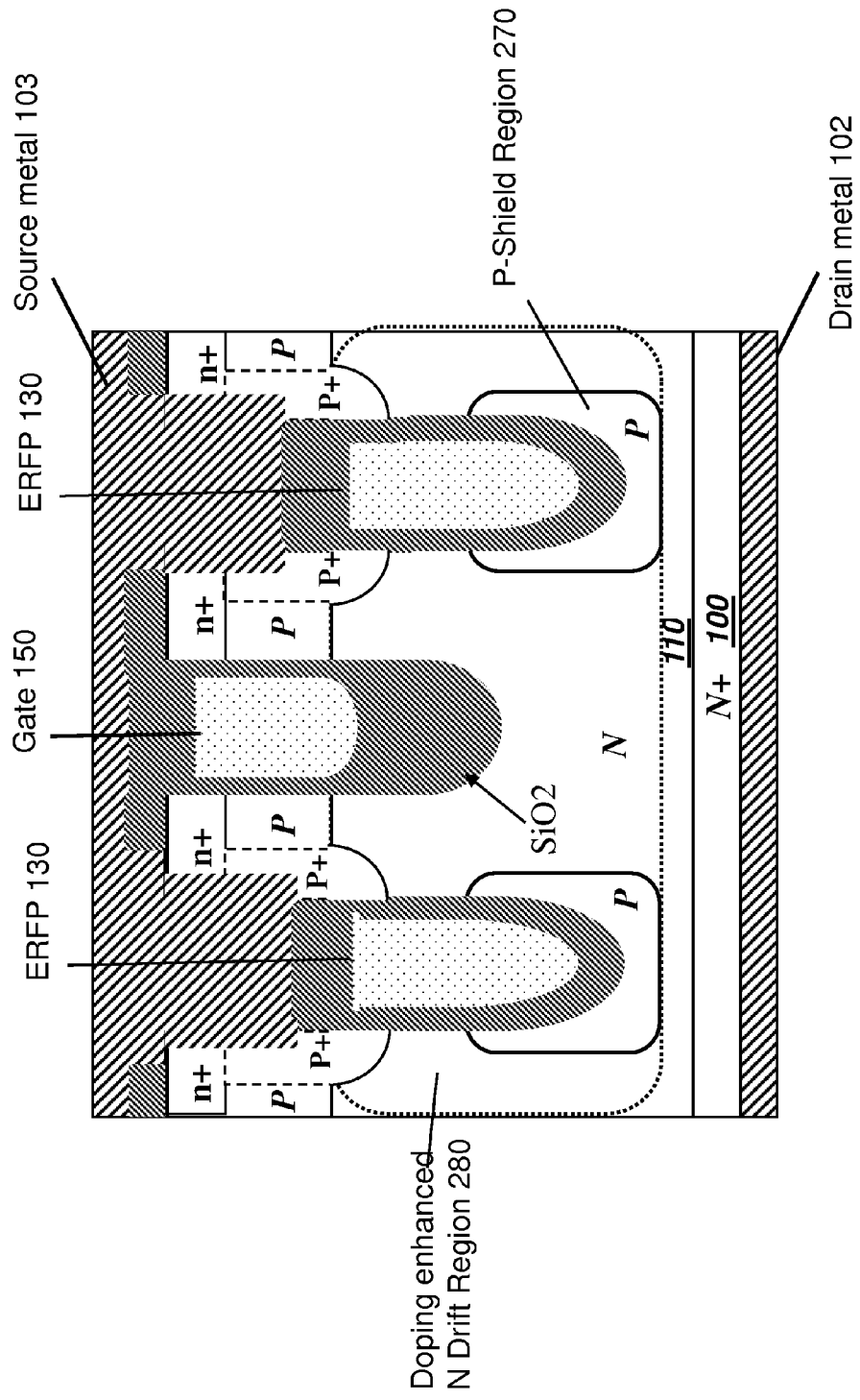
FIG. 2K schematically shows another example of a device structure.

FIG. 2K shows yet another example in which the embedded field plate ERFP trench 130 is deeper than gate trench 150'. This structure extends the breakdown voltage capability of the structure to higher values than those previously shown.

Figure 3A:
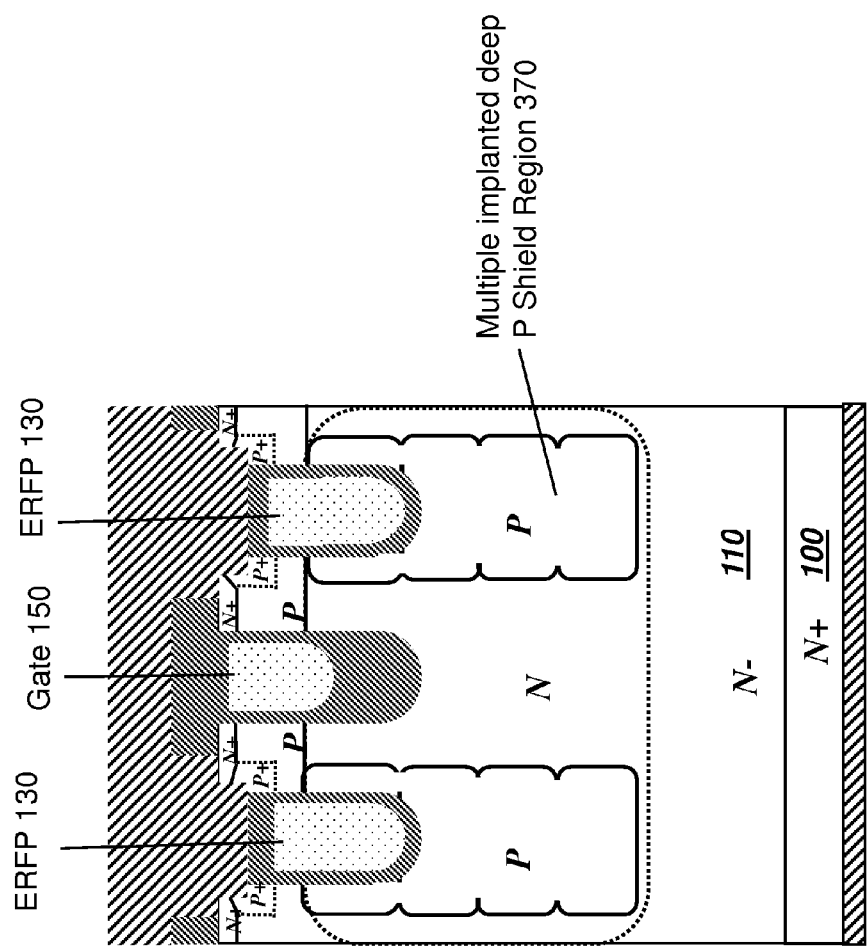
FIG. 3A schematically shows another example of a device structure, which has a very deep shield (pillar) region.

FIG. 3A shows a different example. This is generally somewhat similar to that of FIG. 2B, except that the p-type shield region 370 is much deeper than the shield region 270 of FIG. 2B. This is achieved, for example, by using multiple implants through the bottom of the ERFP trench. In view of the depth of the p-type shield regions 370, they will also be referred to here as "p-pillar" regions.

In this example, the vertical extent of the pillar region 370 below the bottom of the trench is preferably greater than the vertical extent of the embedded field plate.

Figure 3B:
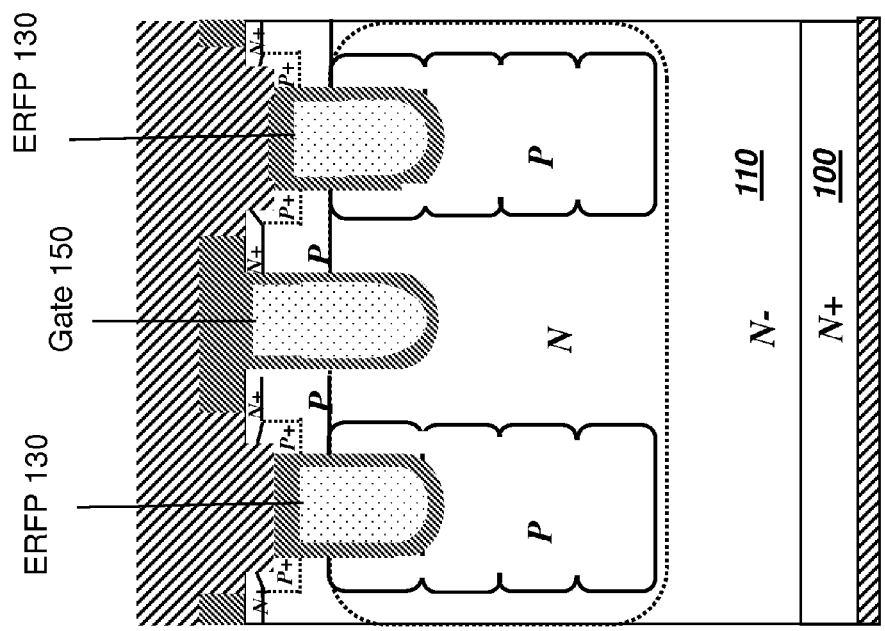
FIG. 3B schematically shows another example of a device structure.

FIG. 3B shows yet another example, which is generally somewhat similar to that of FIG. 3A, except that the gate 150' extends just as deeply as the embedded field plate. This provides a device with simpler fabrication process but with an increased gate-drain capacitance Cgd.

Figure 3C:
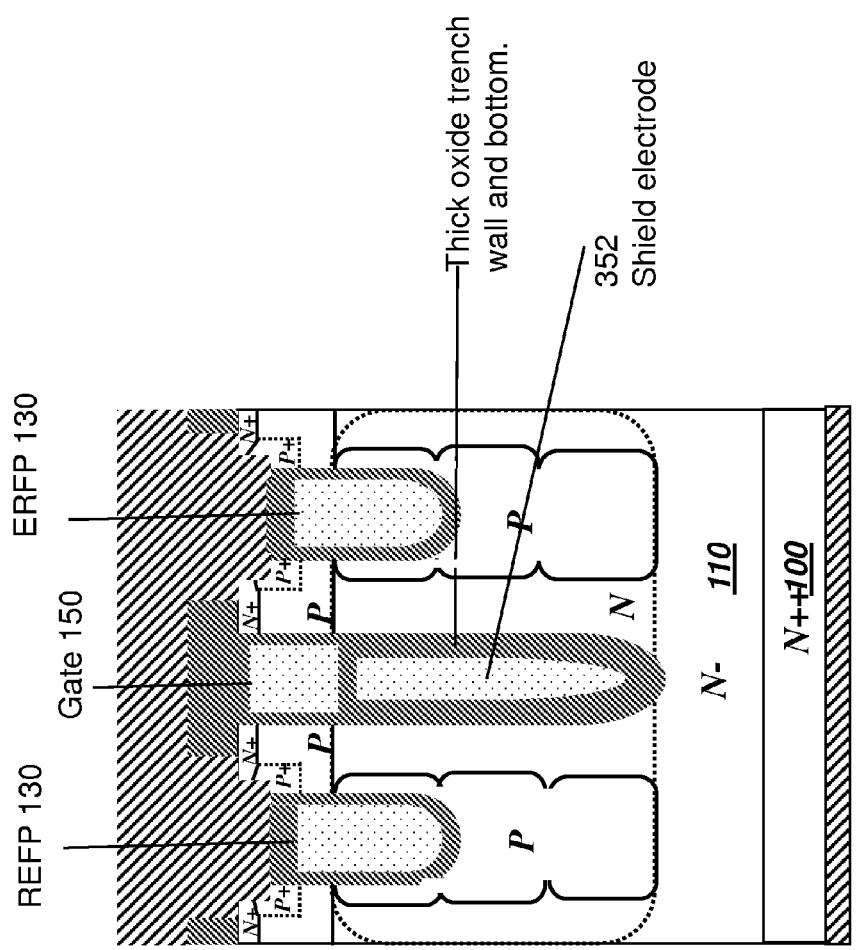
FIG. 3C schematically shows another example of a device structure.

FIG. 3C shows yet another example, which is generally somewhat similar to that of FIG. 3A, except that a shield electrode 352 lies below the gate electrode. This reduces gate-drain coupling. The shield electrode 352 can be tied to the same potential as the embedded field plate, or to a different potential, or less preferably can even be left floating.

In this example, the gate trench is made deep enough that the shield electrode 352 extends down approximately as far as the depth of the p-type pillar regions 370.

FIG. 4A shows the effect of deep p-shield layer. More specifically, FIG. 4A shows potential contours of one specific implementation of the device of FIG. 3A at breakdown.

By comparing FIG. 4A (corresponding to an example of the device structure of FIG. 3A) with FIG. 4B (corresponding to an example of the device structure of FIG. 2J), it can be seen that the deep pillar regions 370 not only deflect the isopotential lines away from the body junction somewhat, but also (more importantly) tend to equalize the spacing of the isopotential lines. This means that the electric field magnitude is more nearly equal throughout the volume of material below the gate and field plate structures. This is desirable, since it maximizes the total voltage drop across that volume of material before breakdown.

In the specific example of FIG. 4A, a device with breakdown voltage of about 120V is simulated. In this example, four different implant steps have been employed to form the P-pillar zones. The implant dopant is B11 and four chain implant conditions are (1) 7E11/cm$^2$ at 60 keV, (2) 8E11/cm$^2$ at 180 keV, (3) 9E11/cm$^2$ at 360 keV, and (4) 1E12/cm$^2$ at 500 keV.

In this example, the wafer's orientation is not off-axis, so that the 0-tilt-angle implant will "channel": a channeling implant will have a longer stopping distance, which is desirable for this particular step. For one example, if the semiconductor structure is monocrystalline silicon, and the <110> direction of the crystal lattice is normal to the surface, the stopping distance of the implanted ions will be greatly increased. (The <110> direction is not the only direction in a diamond-like lattice where ion channeling occurs, but is given merely as one example.) The use of a 0-tilt-angle implant here also helps to minimize lateral diffusion of the implanted ions, so that the implanted p-shield region is self-aligned to the trench as exactly as possible.

Note also that the ratio of energies between the lowest-energy and highest-energy implants is 1:50 in this example. Note also that the doses of the successively-higher-energy implants may increase. This achieves a net doping along the vertical direction inside the P-shield which is close to a constant profile, with the concentration around 3E15/cm$^3$.

In the example of FIG. 4B, a device with breakdown voltage of about 44V is simulated. In this example, two different implant steps have been used to form the P-pillar regions. The implant species is B11 and the two chain implant conditions are (1) 2.3E12/cm$^2$ at 30 keV, and (2) 1.8E12/cm$^2$ at 120 keV.

Figure 5A:
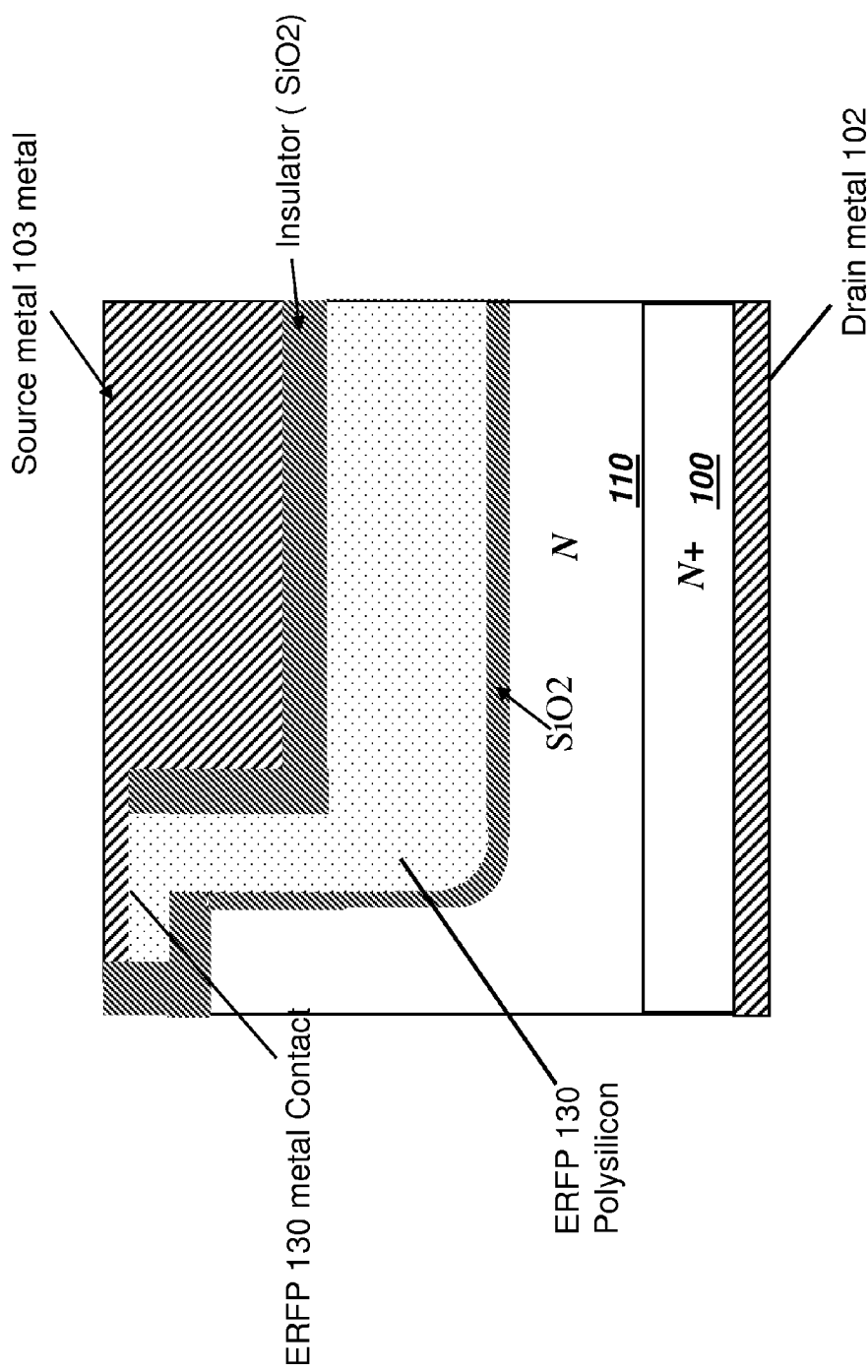
FIGS. 5A, 5B and 5C show three different ways in which an embedded field plate can be contacted outside the active array.
Figure 5B:
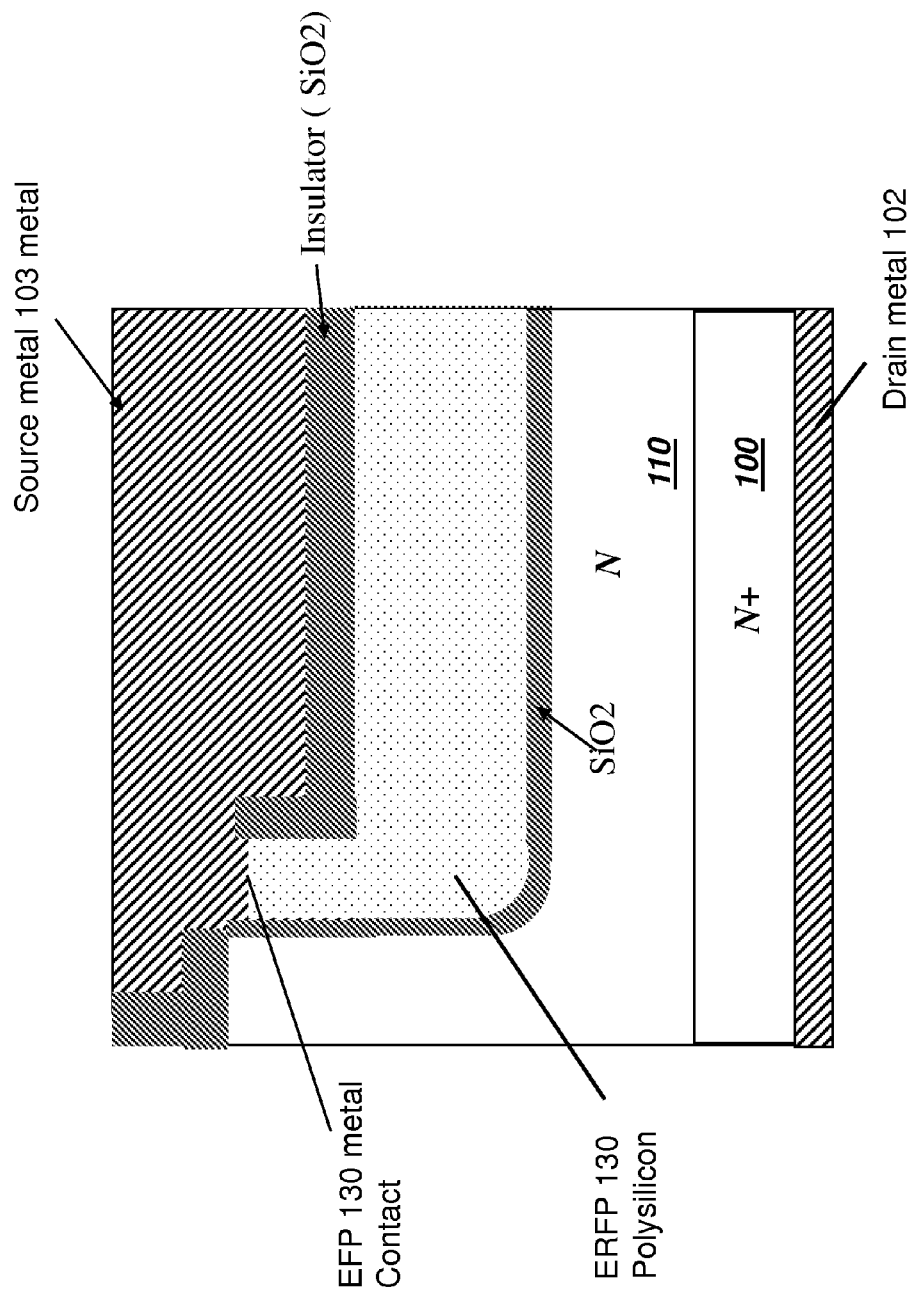
Figure 5C:
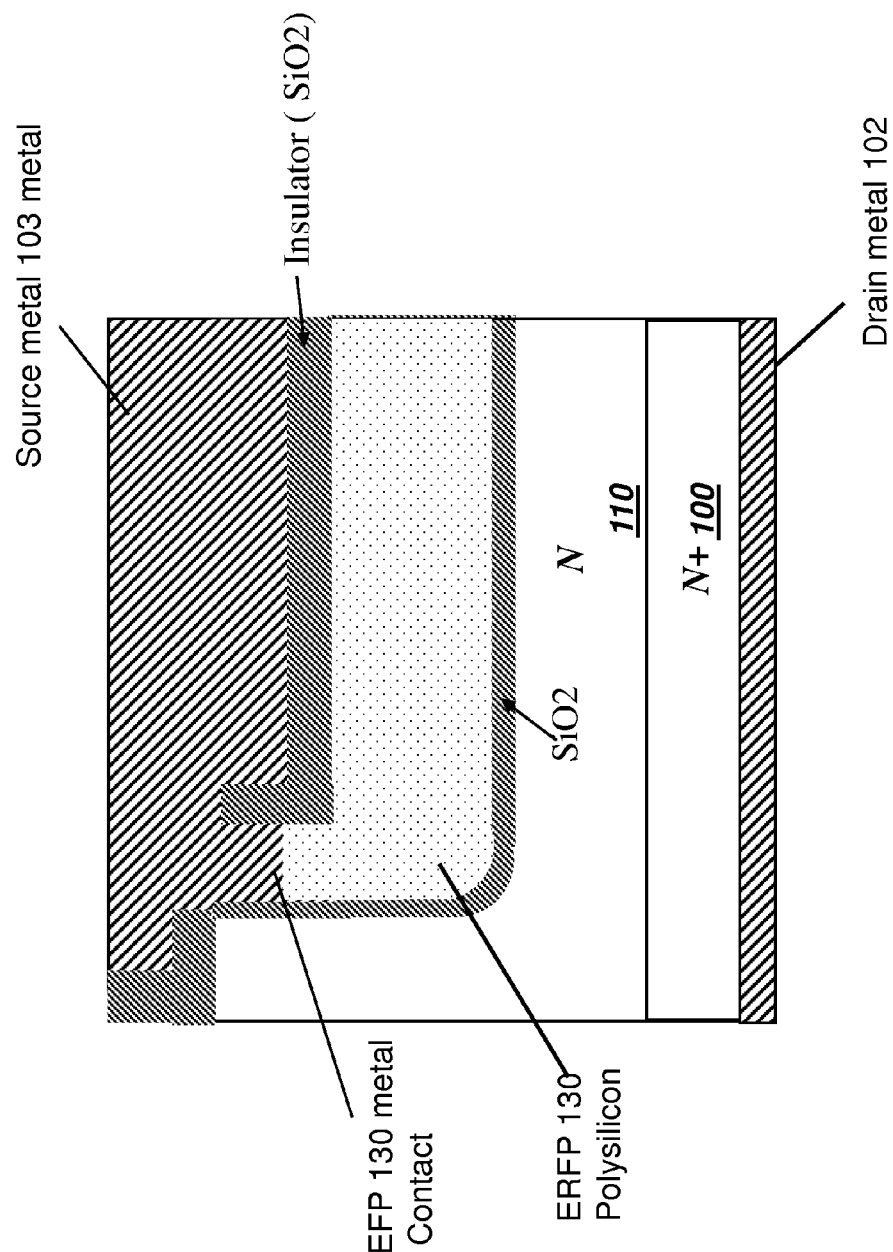

FIGS. 5A, 5B, and 5C show three different ways in which the embedded field plate 130 can be contacted outside the active array. The structures shown are similar to those conventionally used to make contact to the trench gate electrode at locations where active devices are not present.

In these examples, the embedded field plate 130 is contacted by the source metal. However, it is also possible to connect the field plate to a different potential, e.g. one which is offset from the source voltage, or which follows the gate voltage.

FIG. 6 shows a simulated structure with a breakdown voltage of 30V device. Its doping profile along the vertical direction is similar to that shown in FIG. 7B. The major difference between device of FIG. 6 and device of FIG. 7A are epitaxial layer doping and thickness. The FIG. 6 device has 0.22 Ω-cm resistivity with the thickness of 4.5 μm. The FIG. 7A device has 0.33 Ω-cm resistivity with thickness of 5.5 μm. Its breakdown voltage is about 44V.

FIG. 7A shows a more complete simulation of a structure like that of FIG. 2C, including a graphic indication of net doping levels.

FIG. 7B is a plot of doping levels in the structure of FIG. 7A, along a vertical axis near the gate trench. Dimensions are referenced to the bottom of the epitaxial layer 110. Thus the doping of the n++ source peaks at about 2E20, at a depth of about −4.6 microns; the source junction is at about −4.4 microns; the body and body contact doping has a maximum at about 5E17, and a plateau at about 2E17; the body junction is at about 3.9 microns; and the doping of the drift region rises gradually from about 8E15 near the body junction to about 5E19 in the deep drain.

Figure 8B:
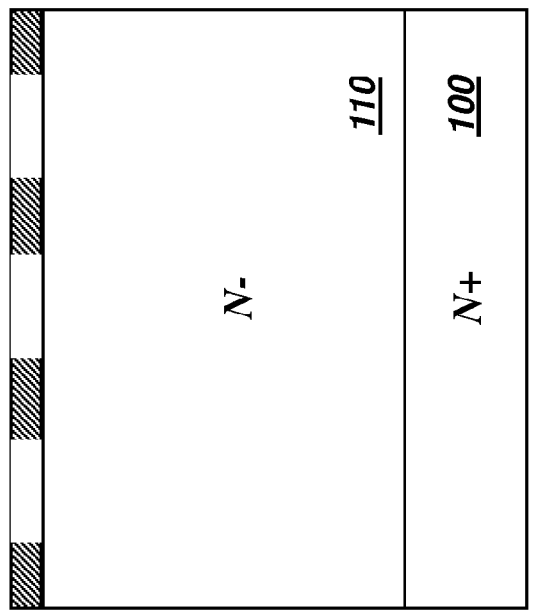
FIGS. 8A-8P show sequential steps in one example of fabrication.
Figure 8A:
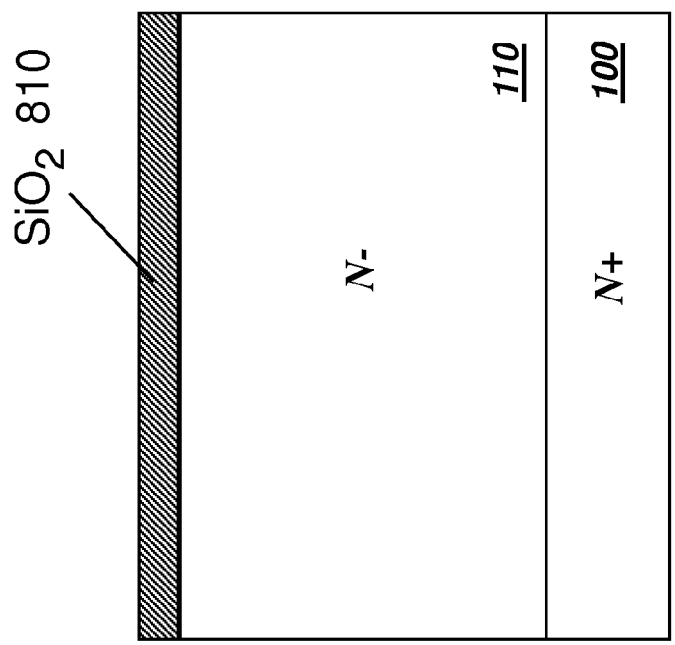
Figure 8D:
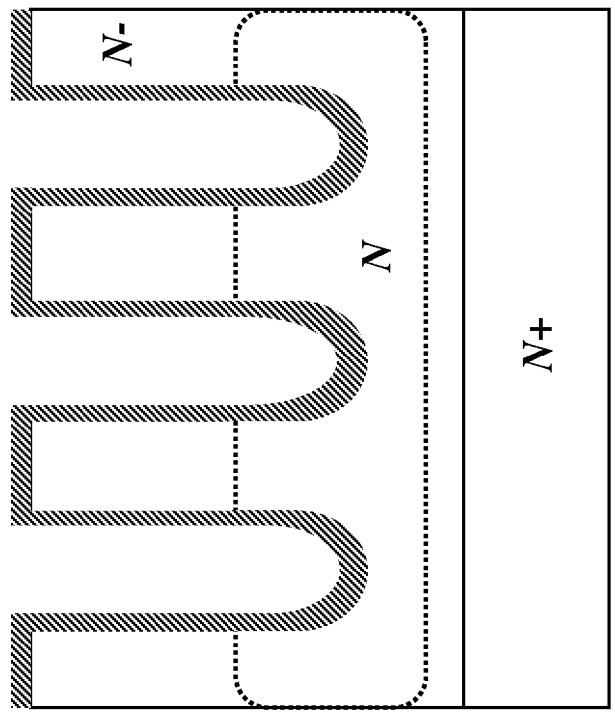
Figure 8C:
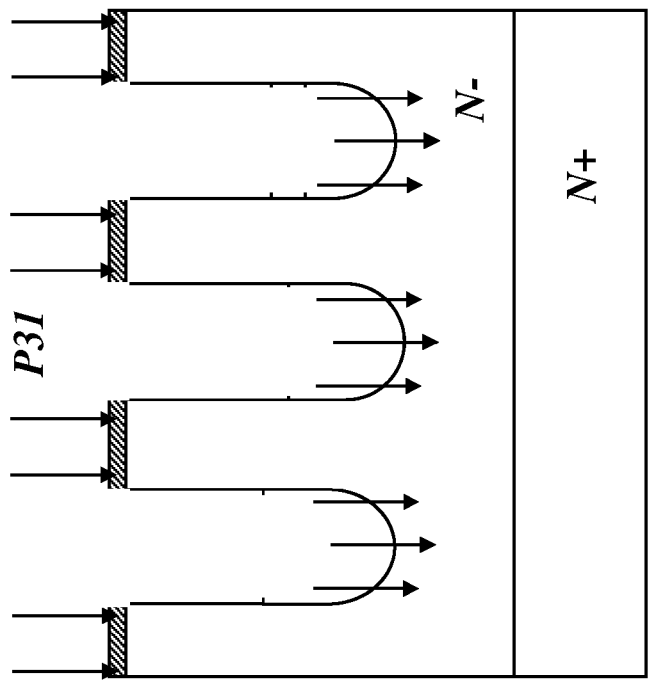
Figure 8E:
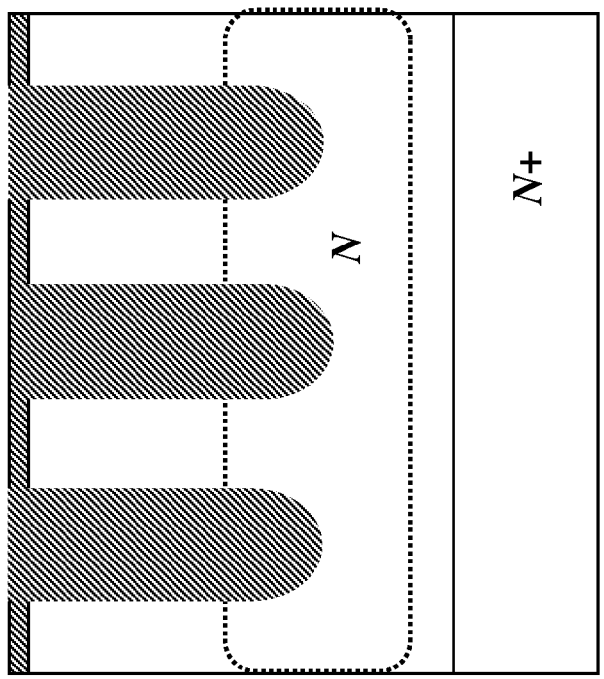
Figure 8F:
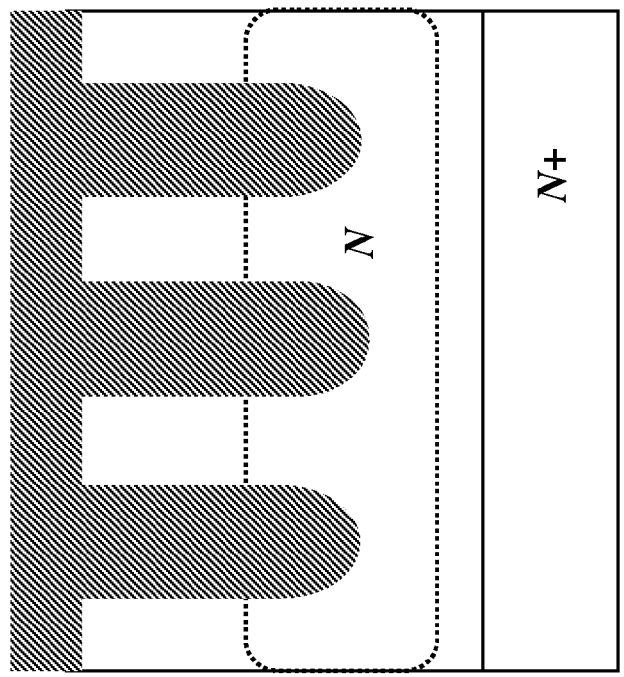
Figure 8G:
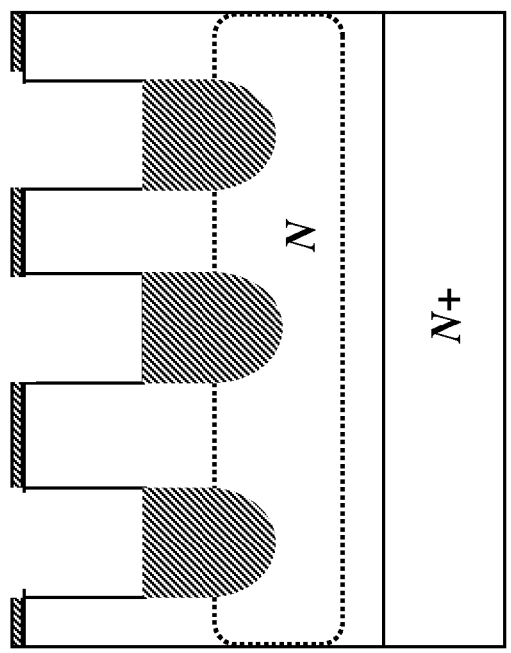
Figure 8H:
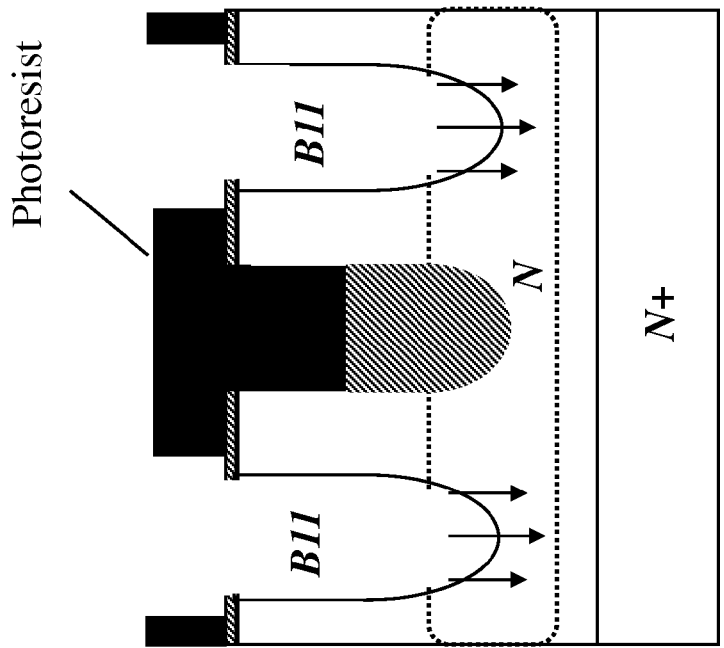
Figure 8I:
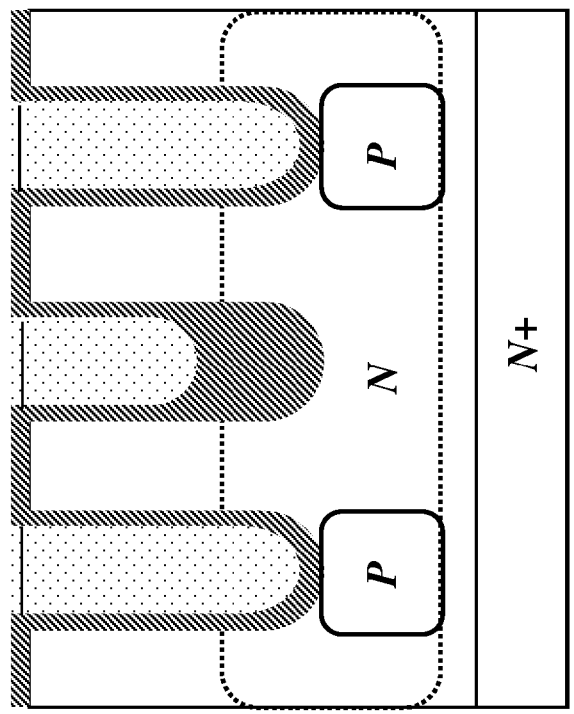
Figure 8J:
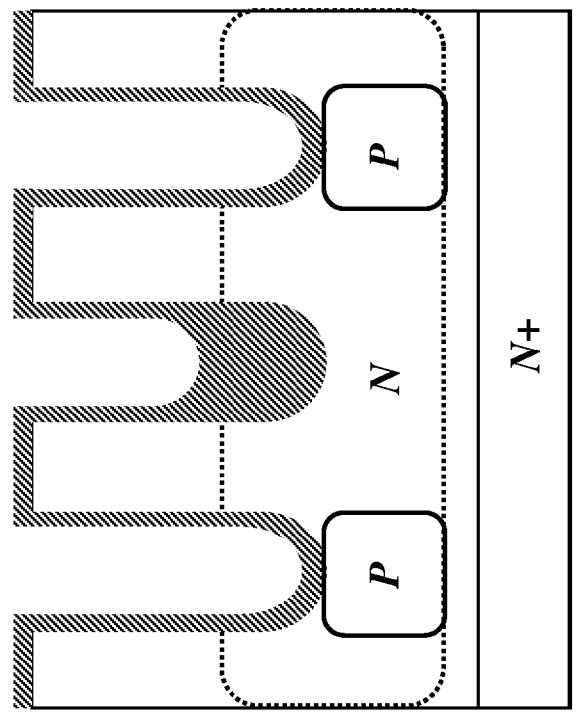
Figure 8L:
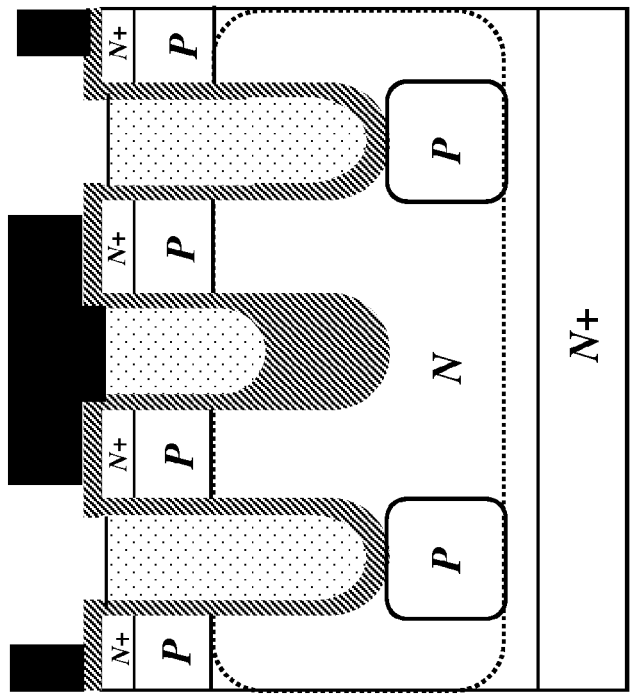
Figure 8K:
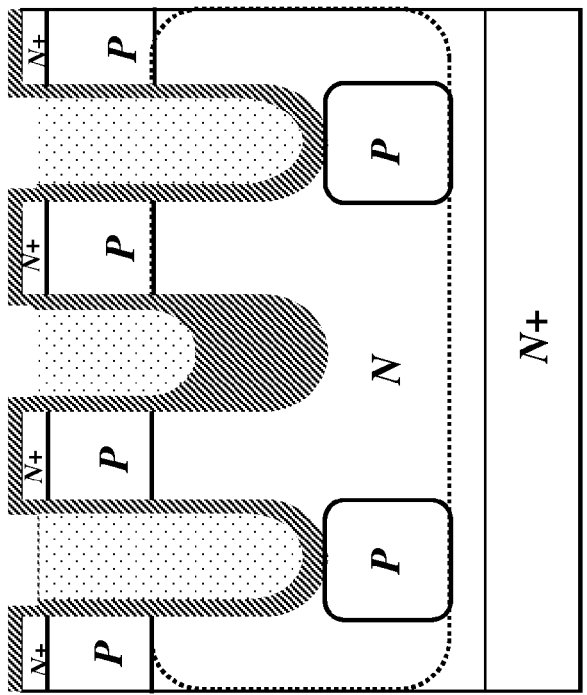
Figure 8N:
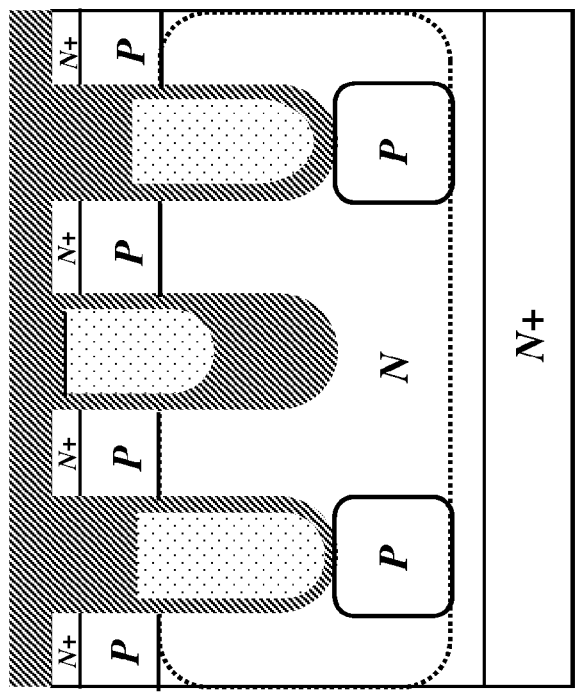
Figure 8M:
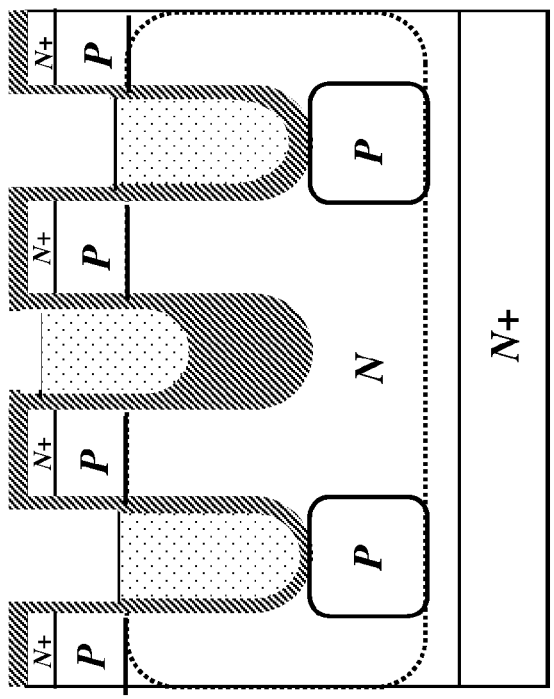
Figure 8P:
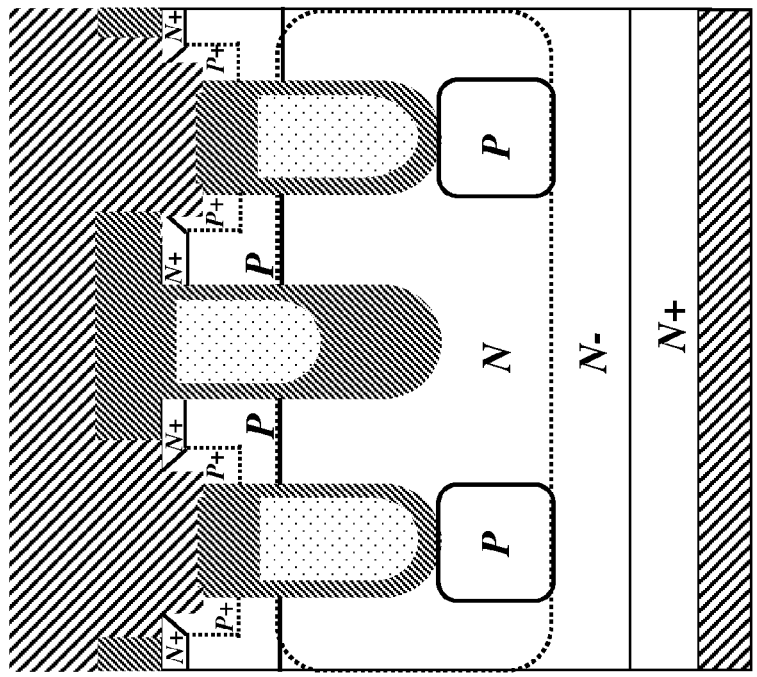

FIGS. 8A-8P show a sequence of steps in fabrication.

In FIG. 8A, an n-on-n+ epitaxial structure has been oxidized and an oxide layer 810 is formed.

In FIG. 8B, the oxide layer 810 has been patterned to form a hard mask.

In FIG. 8C, trenches have been etched in locations defined by the hard mask, and donor atoms ($P^{31}$ in this example) are being implanted, e.g. at a dose of $2\times10^{12}$ cm$^{-2}$, and an energy of 40 keV is implanted and driven in to form the n-enhancement region. This implant is preferably done with 0 tilt angle.

In FIG. 8D, a thermal cycle has been performed to drive in the donor atoms implanted in the steps shown in FIG. 8C. This produces a band of enhanced n-type doping around the depth of the trench bottoms. This has also produced an oxide layer on the sidewalls of the trenches.

In FIG. 8E, the trenches have been filled with a dielectric material, e.g. silicon dioxide.

In FIG. 8F, the thickness of the dielectric material has been reduced, e.g. by chemical-mechanical polishing (CMP).

In FIG. 8G, the dielectric material has been etched back to leave only a portion remaining in the bottoms of the trenches.

In FIG. 8H, the gate trenches have been differentiated from the ERFP trenches. Here, the gate trenches have been covered by a patterned photoresist, and the dielectric has been stripped out of the trenches which will hold field plates. At this point, Boron ($B^{11}$), e.g. $3\times10^{12}$ cm$^{-2}$ at 180 keV, is implanted and driven in to form the p-shield region. This implant is preferably done with 0 tilt angle.

In FIG. 8I, the photoresist has been removed and a thin oxide has been grown on the trench sidewalls. This will serve as the gate oxide and will also provide a sidewall insulator for the field plate.

In FIG. 8J, both trenches have been filled with polysilicon, preferably doped heavily with phosphorus. The polysilicon then etched back below the surface.

In FIG. 8K, a heavy implant has been performed, e.g. $5\times10^{15}$ cm$^{-2}$ of arsenic at 80 keV. The source implant is activated by RTA or by a short thermal cycle. At this point, an implant of Boron, e.g. $6\times10^{12}$ cm$^{-2}$ at 80 keV, is angle implanted and driven in to form the body.

In FIG. 8L, photoresist has been patterned, optionally using the same mask as in FIG. 8H, to cover the gate trenches but not the ERFP trenches.

In FIG. 8M, the polysilicon in the ERFP trenches has been etched back and the photoresist has been removed. This etchback results in the low top surface of the embedded field plate.

In FIG. 8N, a thick insulator, typically silicon dioxide, has been deposited overall and optionally planarized. This will provide the interlevel dielectric over the gate electrode.

Figure 8O:
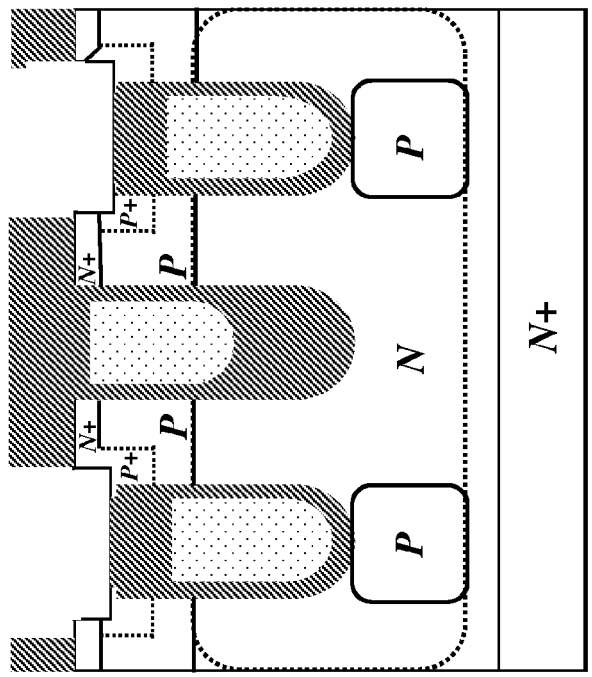

In FIG. 8O, the interlevel dielectric has been patterned and etched to produce the recessed contact over the embedded field plate. Note that this has not been etched away completely, so that the top surface of the field plate will be insulated from the metal which will be deposited. A heavy low-energy implant of acceptors has also been performed, e.g. $2\times10^{15}$ cm$^{-2}$ of $BF_2$ at 40 keV.

In FIG. 8P, the source and drain metallizations 102 and 103 have been deposited. After the source metallization layer is patterned (also forming connections to the gate electrode at locations not shown), additional steps can optionally be used to form additional wiring or passive device structures.

This process sequence is just one example of a process sequence to form a single discrete device, but as discussed below, many alternatives are possible, and more complex structures can also be fabricated.

FIGS. 9A-9R show another process sequence in great detail. Many of the steps are very similar to the corresponding steps in the sequence of FIGS. 8A-8P.

In FIG. 9A, an n-on-n+ epitaxial structure has been oxidized and an oxide layer 810 is formed.

In FIG. 9B, the oxide layer 810 has been patterned to form a hard mask.

In FIG. 9C, trenches have been etched in locations defined by the hard mask and donor atoms ($P^{31}$ in this example) are being implanted.

In FIG. 9D, a thermal cycle has been performed to drive in the donor atoms implanted in the steps shown in FIG. 8C. This produces a band of enhanced n-type doping around the depth of the trench bottoms. This has also produced a sacrificial oxide layer on the sidewalls of the trenches.

In FIG. 9E, the trenches have been filled with a dielectric material, e.g. silicon dioxide.

In FIG. 9F, the thickness of the dielectric material has been reduced, e.g. by chemical-mechanical polishing (CMP).

In FIG. 9G, the dielectric material has been etched back to leave only a portion remaining in the bottoms of the trenches.

In FIG. 9H, the gate trenches have been differentiated from the ERFP trenches. Here, the gate trenches have been covered by a patterned photoresist, and the bottom oxide has been stripped out of the trenches which will hold field plates. A high-energy boron implant is now being performed, e.g. $2\times10^{12}$ cm$^{-2}$ at 40 keV.

In FIG. 9I, the photoresist has been removed and a thin oxide has been grown on the trench sidewalls. This will serve as the gate oxide and will also provide a sidewall insulator for the field plate.

In FIG. 9J, both trenches have been filled with polysilicon, preferably doped heavily with phosphorus.

In FIG. 9K, a heavy donor implant has been performed, e.g. $5\times10^{15}$ cm$^{-2}$ of arsenic at 80 keV. This forms the source regions.

In FIG. 9L, photoresist has been patterned to expose the ERFP trenches, but not the gate trenches.

In FIG. 9M, the polysilicon in the ERFP trenches has been etched back and the photoresist has been removed. This etchback results in the low top surface of the embedded field plate.

In FIG. 9N, a high-energy angle implant of boron has been performed and driven in to create a body region 120, which includes downward extensions 121.

FIG. 9O shows an alternative to the step of FIG. 9N, wherein two species are implanted. In this example, the donor species is phosphorus, and the acceptor species is preferably boron. This produces the n-type enhanced doping component, as shown in FIG. 1E, which surrounds the downward extension 121 of the body region 120.

FIG. 9P shows the next step after FIG. 9N. Here, an interlevel dielectric has been deposited and planarized.

In FIG. 9Q, the interlevel dielectric has been patterned and etched to produce the recessed contact over the embedded field plate. Note that the dielectric has not been etched away completely, so that the top surface of the field plate will be insulated from the metal which will be deposited. A heavy low-energy implant of acceptors has also been performed, e.g. $2 \times 10^{15}$ cm$^{-2}$ of $BF_2$ at 40 keV. This forms p+ body contact diffusions.

In FIG. 9R, the source and drain metallizations 102 and 103 have been deposited. After the source metallization layer is patterned (also forming connections to the gate electrode at locations not shown), additional steps can optionally be used to form additional wiring or passive device structures.

This process sequence is just one example of a process sequence to form a single discrete device, but as discussed below many alternatives are possible, and more complex structures can also be fabricated.

FIGS. 10A-10E show a further alternative process flow. In FIG. 10A, an angle implant of donor atoms provides a local enhancement of doping next to all of the trenches. FIGS. 10B-10E show how this local enhancement is combined into the rest of the process, to result in a doping enhancement, as shown in FIG. 2E, which is self-aligned to the gate trench.

According to various disclosed innovative embodiments, there is provided: A power semiconductor device comprising a semiconductor source region, which is heavily doped with a first conductivity type; a semiconductor body region, which has a second conductivity type and is located at least partially beneath the source region; a first trench which extends through the source and body regions, and includes at least one gate electrode which is capacitively coupled to at least part of the body region; and a second trench which is at least as deep as the first trench, and which contains a field plate covered by an insulator, the second trench extending down through the body region into a first-conductivity-type semiconductor drift region which is more lightly doped than the source region; a recessed metallic source contact overlying the field plate, but separated therefrom at active device locations by the insulator, and making ohmic contact to the source region; wherein, at said active device locations, the top of the field plate is deeper than the top of the gate electrode, and the bottom of the field plate is deeper than the bottom of the gate electrode, whereby said gate electrode can invert at least part of the body region to permit passage of majority carriers from the source region through the inverted part of the body region into the drift region, and the majority carriers can pass through the drift region into a first-conductivity-type drain region.

According to various disclosed innovative embodiments, there is provided: A power semiconductor device comprising a source region having a first conductivity type; a body region, which has a second conductivity type and is located at least partially beneath the source region; a first-conductivity-type drain region, and a first-conductivity-type drift region which separates the drain region from the body; a first trench which extends through the source and body regions, and includes at least one gate electrode which is capacitively coupled to at least part of the body region; and a second trench which is at least as deep as the first trench, and which contains a field plate; wherein the field plate is covered by an insulator at least some active device locations; wherein a shielding portion of the drift region, below the second trench, contains a lower net concentration of first-conductivity-type dopant atoms than the drift region generally; and wherein, at the active device locations, the top of the field plate is deeper than the top of the gate electrode, and the bottom of the field plate is deeper than the bottom of the gate electrode; whereby the gate electrode can invert at least part of the body region to permit passage of majority carriers from the source region through the inverted part of the body region into the drift region, and the majority carriers can pass through the drift region into a first-conductivity-type drain region.

According to various disclosed innovative embodiments, there is provided: A power semiconductor device comprising a first trench which includes at least one gate electrode; a source region, which is heavily doped with a first conductivity type; a second-conductivity-type body region in proximity to the first trench, the gate electrode being capacitively coupled to a portion of the body region; and a second trench containing a recessed field plate covered by an insulator, the second trench extending down through the body region into a first-conductivity-type semiconductor drift region which is more lightly doped than the source region; and a recessed source contact overlying the recessed field plate, but separated therefrom by the insulator, and making ohmic contact to the source region; whereby the gate electrode can invert at least part of the body region to permit passage of majority carriers from the source region through the inverted part of the body region into the drift region, and the majority carriers can pass through the drift region into a drain region.

According to various disclosed innovative embodiments, there is provided: A power semiconductor device comprising a first trench which includes at least one insulated gate electrode; a first-conductivity-type source region; a p-type body region in proximity to the first trench, the gate electrode being capacitively coupled to a channel portion of the body region; a second trench, positioned on two opposite sides of the first trench, and containing a recessed field plate covered by an insulator; the channel being electrically interposed between the source region and a first-conductivity-type drift region; and the drift region and channel portions jointly being electrically interposed in series between the source region and a first-conductivity-type drain region; and an additional second-conductivity-type region which protrudes down below the body region into the drift region, and which has a profile which is at least partly determined by the height of the recessed field plate.

According to various disclosed innovative embodiments, there is provided: A semiconductor device structure comprising a first-conductivity source region, a second-conductivity-type body region, a drift region, and a drain; at least one first trench containing an insulated gate electrode which is capacitively coupled to at least a portion of the body region; at least one second trench which contains an embedded field plate which is recessed below the source region, the embedded field plate lying beneath a metal contact which makes ohmic contact to the source region, the metal contact also making ohmic contact to a second-conductivity-type region which abuts and is more heavily doped than the body region; wherein the embedded field plate is both insulated from the drift region, and also locally electrically insulated, at the location where the metal contact makes contact to the second-conductivity-type region, from the metal contact.

According to various disclosed innovative embodiments, there is provided: A power semiconductor device comprising a source region having a first conductivity type; a body region, which has a second conductivity type and is located at least partially beneath the source region; a first-conductivity-type drain region, and a first-conductivity-type drift region which separates the drain region from the body; a first trench which extends through the source and body regions, and includes at least one gate electrode which is capacitively coupled to at least part of the body region; a second trench which is at least as deep as the first trench, and which contains a field plate; wherein the field plate is covered by an insulator at least some active device locations; and a second-conductivity-type shielding region, located at least partly below the second trench, which has a vertical extent, below the bottom of the second trench, which is greater than the vertical height of the field plate in the active device locations; whereby the gate electrode can invert at least part of the body region to permit passage of majority carriers from the source region through the inverted part of the body region into the drift region, and the majority carriers can pass through the drift region into a first-conductivity-type drain region.

According to various disclosed innovative embodiments, there is provided: A method for making a power semiconductor device comprising the steps, in any order, of providing a semiconductor structure; etching at least one first trench, and one or more second trenches which flank at least part of the first trench on opposite sides; forming an n+ source region and a p-type body region in proximity to the first trench; forming an insulated gate electrode in the first trench; forming a recessed field plate in the second trench, and covering the recessed field plate with an insulator; forming at least one p+ region which protrudes down into the semiconductor structure, and which has a profile which corresponds to ion introduction and diffusion which is at least partly determined by the height of the recessed field plate; forming a recess over the field plate, and forming metallization, at least within the recess, which makes lateral contact to both the source region and the p+ region; connecting an n+ semiconductor drain region, which is electrically separated from the source region by the drift region and body region, to provide a switchable connection between the source region and drain region, controlled by the voltage of the gate electrode.

According to various disclosed innovative embodiments, there is provided: A method for making a power semiconductor device comprising the steps, in any order, of providing a first-conductivity-type semiconductor structure; etching at least one first trench, and one or more second trenches which flank at least part of the first trench on opposite sides; laterally outdiffusing first-conductivity-type dopant atoms from at least one of the trenches; implanting dopant atoms into the second trench, while the second trench is still unfilled, in a dose sufficient to create a second-conductivity-type region below the second trench, within the structure, which has a vertical extent which is greater than the depth of the second trench; forming an n+ source region and a p-type body region in proximity to the first trench; forming an insulated gate electrode in the first trench; forming a recessed field plate in the second trench; covering the recessed field plate with an insulator; forming at least one p+ region which is contiguous with the body region; forming a recess over the field plate, and forming metallization, at least within the recess, which makes lateral contact to both the source region and the p+ region; and connecting an n+ semiconductor drain region, which is electrically separated from the source region by the drift region and body region, to provide a switchable connection between the source region and drain region, controlled by the voltage of the gate electrode.

According to various disclosed innovative embodiments, there is provided: A method for making a power semiconductor device comprising the steps, in any order, of providing a first-conductivity-type semiconductor structure, and etching at least one first trench and at least one second trench into the semiconductor structure; performing a channeling implant through the second trench but not the first trench, in a dose sufficient to create a second-conductivity-type region below the second trench, within the semiconductor structure, which has a vertical extent which is greater than the depth of the second trench; forming a first-conductivity-type source region and a second-conductivity-type body region in proximity to the first trench; forming an insulated gate electrode in the first trench, forming a recessed field plate in the second trench, and covering the recessed field plate with an insulator; forming at least one second-conductivity-type body contact region which is contiguous with the body region; forming a recess over the field plate, and forming metallization, at least within the recess, which makes lateral contact to both the source region and the second-conductivity-type region; and connecting a first-conductivity-type semiconductor drain region, which is electrically separated from the source region by the drift region and body region, to provide a switchable connection between the source region and drain region, controlled by the voltage of the gate electrode.

According to various disclosed innovative embodiments, there are provided semiconductor power devices, and related methods, wherein a recessed contact makes lateral ohmic contact to the source diffusion, but is insulated from the underlying recessed field plate (ERFP). Such an insulated ERFP is here referred to as an embedded recessed field plate ERFP.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

The specific electrical characteristics of devices fabricated using the methods described in this disclosure depend on a number of factors including the thickness of the layers, their doping levels, the materials being used, the geometry of the layout, etc. One of ordinary skill in the art will realize that simulation, experimentation, or a combination thereof can be used to determine the design parameters needed to operate as intended.

While the figures shown in this disclosure are qualitatively correct, the geometries used in practice may differ and should not be considered a limitation in any way. It is understood by those of ordinary skill in the art that the actual layout will vary depending on the specifics of the implementation and any depictions illustrated herein should not be considered a limitation in any way.

All the above variants of the structure can be realized in stripe or cellular layout, such as square, rectangular, hexagonal or circular layouts.

Additional general background, which helps to show variations and implementations, as well as some features which can be synergistically with the inventions claimed below, may be found in the following U.S. patent applications. All of these applications have at least some common ownership, copendency, and inventorship with the present application: All of these applications, and all of their priority applications, are hereby incorporated by reference: US20080073707; US20080191307; US20080164516; US20080164518; US20080164520; US20080166845; US20090206924; US20090206913, US20090294892; US20090309156; US20100013552; US20100025726; US20100025763; US20100084704; US20100219462; US20100219468; US20100214016; US20100308400; US20100327344; and unpublished U.S. application Ser. Nos. 12/431,852; 12/369,385; 12/720,856; 12/759,696; 12/790,734; 12/806,203; 12/834,573; 12/835,636; 12/887,303; 12/939,154; and 13/004,054. Applicants reserve the right to claim priority from these applications, directly or indirectly, and therethrough to even earlier applications, in all countries where such priority can be claimed.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC Section 112 unless the exact words "means for" are followed by a participle.

The claims as filed are intended to be as comprehensive as possible, and NO subject matter is intentionally relinquished, dedicated, or abandoned.

What is claimed is:

1. A power semiconductor device, comprising:
   a semiconductor source region, which is heavily doped with a first conductivity type;
   a semiconductor body region, which has a second conductivity type and is located at least partially beneath said source region;
   a first trench which extends through said source and body regions, and includes at least one gate electrode which is capacitively coupled to at least part of said body region; and
   a second trench which is at least as deep as said first trench, and which contains a field plate covered by an insulator, said second trench extending down through the body region into a first-conductivity-type semiconductor drift region which is more lightly doped than the source region;
   a recessed metallic source contact overlying said field plate, but separated therefrom at active device locations by said insulator, and making ohmic contact to said source region;
   wherein, at said active device locations, the top of said field plate is deeper than the top of said gate electrode, and the bottom of said field plate is deeper than the bottom of said gate electrode;
   whereby said gate electrode can invert at least part of the body region to permit passage of majority carriers from the source region through the inverted part of the body region into the drift region, and the majority carriers can pass through the drift region into a first-conductivity-type drain region;
   wherein said body region has a lower surface which is not planar; and further comprising an additional population of first-conductivity-type dopants surrounding downwardly extending parts of said lower surface.

2. The power semiconductor device of claim 1, further comprising a second-conductivity-type region below the bottom of said second trench.

3. The power semiconductor device of claim 1, wherein said recessed contact is filled with a first metallic material, and is overlain by a patterned conductive layer of a second metallic material.

4. The power semiconductor device of claim 1, wherein said field plate is electrically connected to said source region.

5. The power semiconductor device of claim 1, further comprising a conductive shield electrode in said first trench below said gate electrode.

6. The power semiconductor device of claim 1, wherein said second trench does not have completely vertical sidewalls, and is narrower at the bottom than at the top.

7. The power semiconductor device of claim 1, wherein said gate electrode extends to about the same depth as said field plate.

8. The power semiconductor device of claim 1, wherein at least one of said gate electrode and said recessed field plate comprises doped polysilicon.

9. The power semiconductor device of claim 1, wherein said gate electrode and said recessed field plate are both made of doped polysilicon.

10. The power semiconductor device of claim 1, wherein said source region and said body region define a junction therebetween, and wherein said recessed field plate has a highest point, in at least some locations, which is lower than any nearby portion of said junction.

11. The power semiconductor device of claim 1, further comprising a heavily doped second-conductivity-type region which protrudes down into said drift region, and which has a profile which is self-aligned to an upper corner of the recessed field plate.

12. The power semiconductor device of claim 1, wherein said drift region overlies a heavily doped first-conductivity-type region which is connected as a drain region.

13. The power semiconductor device of claim 1, wherein said first conductivity type is n-type.

14. The device of claim 1, further comprising a third diffusion which lies partly below and is insulated from said recessed field plate.

15. A power semiconductor device, comprising:
   a source region having a first conductivity type;
   a body region, which has a second conductivity type and is located at least partially beneath said source region;
   a first-conductivity-type drain region, and a first-conductivity-type drift region which separates said drain region from said body;
   a first trench which extends through said source and body regions, and includes at least one gate electrode which is capacitively coupled to at least part of said body region; and
   a second trench which is at least as deep as said first trench, and which contains a field plate;
   wherein the field plate is covered by an insulator at least some active device locations;
   wherein a shielding portion of said drift region, below said second trench, contains a lower net concentration of first-conductivity-type dopant atoms than said drift region generally; and
   wherein, at said active device locations, the top of said field plate is deeper than the top of said gate electrode, and the bottom of said field plate is deeper than the bottom of said gate electrode;
   whereby said gate electrode can invert at least part of the body region to permit passage of majority carriers from the source region through the inverted part of the body region into the drift region, and the majority carriers can pass through the drift region into a first-conductivity-type drain region.

16. The power semiconductor device of claim 15, further comprising an additional concentration of first-conductivity-type dopant atoms within said drift region, at depths corresponding to at least some parts of said field plates and at least some parts of said shielding portions.

17. The power semiconductor device of claim 15, wherein said shielding portion has said second conductivity type.

18. The power semiconductor device of claim 15, wherein said shielding portion has said second conductivity type, and has a net dopant concentration which is less than $10^{15}$ cm$^{-3}$.

* * * * *